US012238913B2

(12) United States Patent
Sharma et al.

(10) Patent No.: US 12,238,913 B2
(45) Date of Patent: Feb. 25, 2025

(54) TWO TRANSISTOR MEMORY CELL USING STACKED THIN-FILM TRANSISTORS

(71) Applicant: Intel Corporation, Santa Clara, CA (US)

(72) Inventors: Abhishek A. Sharma, Portland, OR (US); Juan G. Alzate-Vinasco, Tigard, OR (US); Fatih Hamzaoglu, Portland, OR (US); Bernhard Sell, Portland, OR (US); Pei-hua Wang, Beaverton, OR (US); Van H. Le, Beaverton, OR (US); Jack T. Kavalieros, Portland, OR (US); Tahir Ghani, Portland, OR (US); Umut Arslan, Portland, OR (US); Travis W. Lajoie, Forest Grove, OR (US); Chieh-jen Ku, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/161,915

(22) Filed: Jan. 31, 2023

(65) Prior Publication Data

US 2023/0171936 A1    Jun. 1, 2023

Related U.S. Application Data

(63) Continuation of application No. 16/133,655, filed on Sep. 17, 2018, now abandoned.

(51) Int. Cl.
*H10B 10/00* (2023.01)
*G11C 11/403* (2006.01)
*H10B 12/00* (2023.01)

(52) U.S. Cl.
CPC ............ *H10B 10/00* (2023.02); *G11C 11/403* (2013.01); *H10B 12/01* (2023.02); *G11C 2211/4066* (2013.01)

(58) Field of Classification Search
CPC ........ H10B 10/00; H10B 12/01; H10B 12/00; H10B 12/30; G11C 11/403;
(Continued)

(56) References Cited

U.S. PATENT DOCUMENTS

2011/0122670 A1* 5/2011 Yamazaki ............... H01L 29/24
                                                                          365/72
2016/0267950 A1* 9/2016 Yamamoto .............. G11C 11/24
(Continued)

FOREIGN PATENT DOCUMENTS

WO    WO-2018004659 A1 *  1/2018

*Primary Examiner* — Jerome Leboeuf
(74) *Attorney, Agent, or Firm* — Akokna IP PC

(57) ABSTRACT

Described herein are two transistor (2T) memory cells that use TFTs as access and gain transistors. When one or both transistors of a 2T memory cell are implemented as TFTs, these transistors may be provided in different layers above a substrate, enabling a stacked architecture. An example 2T memory cell includes an access TFT provided in a first layer over a substrate, and a gain TFT provided in a second layer over the substrate, the first layer being between the substrate and the second layer (i.e., the gain TFT is stacked in a layer above the access TFT). Stacked TFT based 2T memory cells allow increasing density of memory cells in a memory array having a given footprint area, or, conversely, reducing the footprint area of the memory array with a given memory cell density.

26 Claims, 10 Drawing Sheets

(58) Field of Classification Search
CPC ......... G11C 2211/4066; H01L 25/0652; H01L 25/18; H01L 24/13; H01L 24/16; H01L 2224/16225; H01L 2224/16235; H01L 2924/15174; H01L 2924/15192; H01L 2924/15311; H01L 2924/181; H01L 27/1225; H01L 29/78669; H01L 29/78693; H01L 27/0207
See application file for complete search history.

(56) References Cited

U.S. PATENT DOCUMENTS

2018/0075900 A1\* 3/2018 Ishizu .................... G11C 16/28
2018/0102365 A1\* 4/2018 Van Houdt ........... G11C 11/405

\* cited by examiner

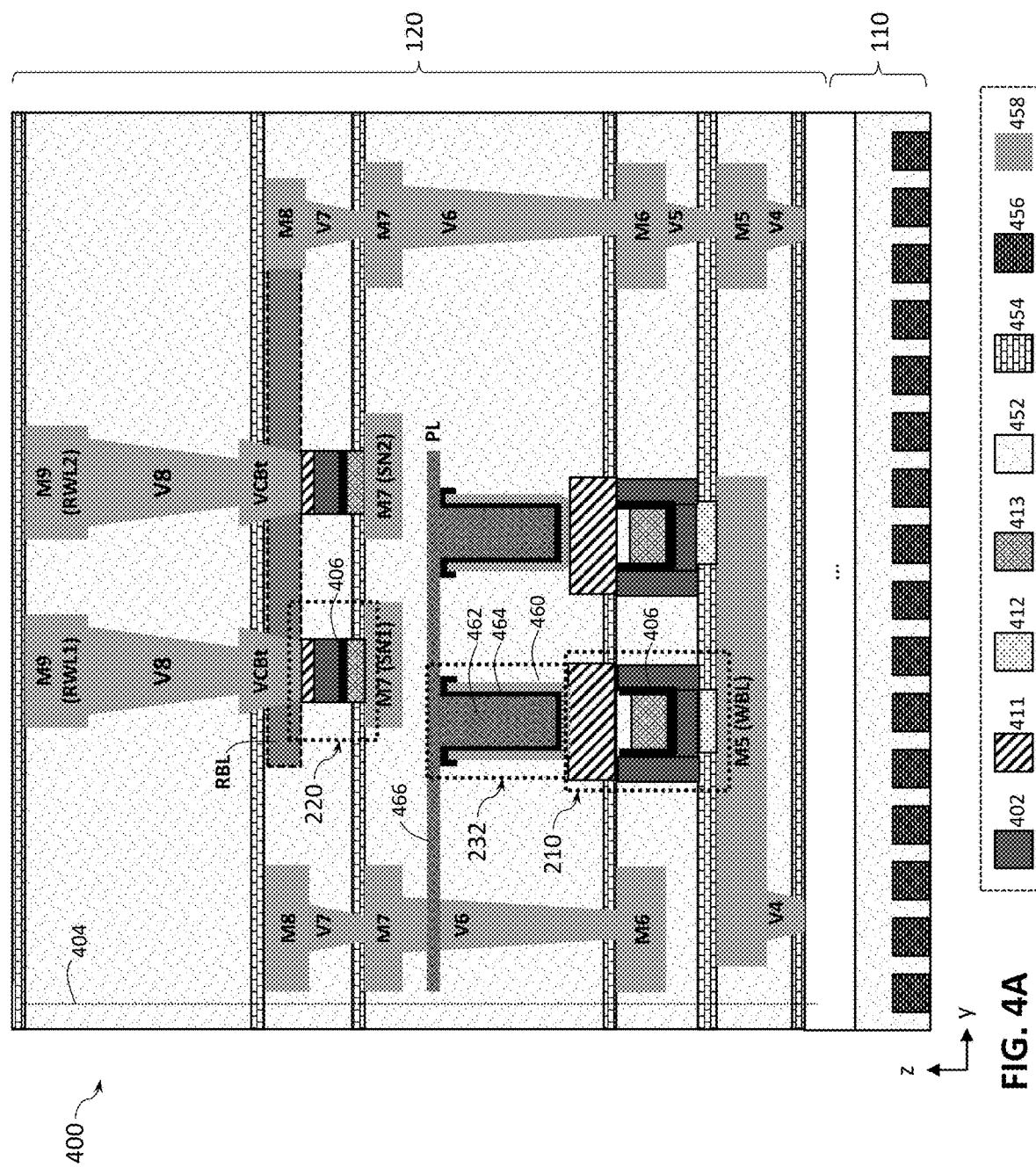

TWO TRANSISTOR MEMORY CELL USING STACKED THIN-FILM TRANSISTORS

CROSS-REFERENCE TO RELATED APPLICATION

This application is a continuation of (and claims the benefit of priority under 35 U.S.C. § 120 to) U.S. patent application Ser. No. 16/133,655, filed Sep. 17, 2018, and entitled "TWO TRANSISTOR MEMORY CELL USING STACKED THIN-FILM TRANSISTORS," which is hereby incorporated by reference herein in its entirety.

BACKGROUND

In processors, memory is critical for performing many functions. Static random-access memory (SRAM) and dynamic random-access memory (DRAM) are examples of memory technologies.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 4A-4B are cross-sectional (y-z and x-z) views of an example IC device implementing a 2T memory cell using two stacked TFTs, according to some embodiments of the present disclosure.

DETAILED DESCRIPTION

Overview

Figure 1:
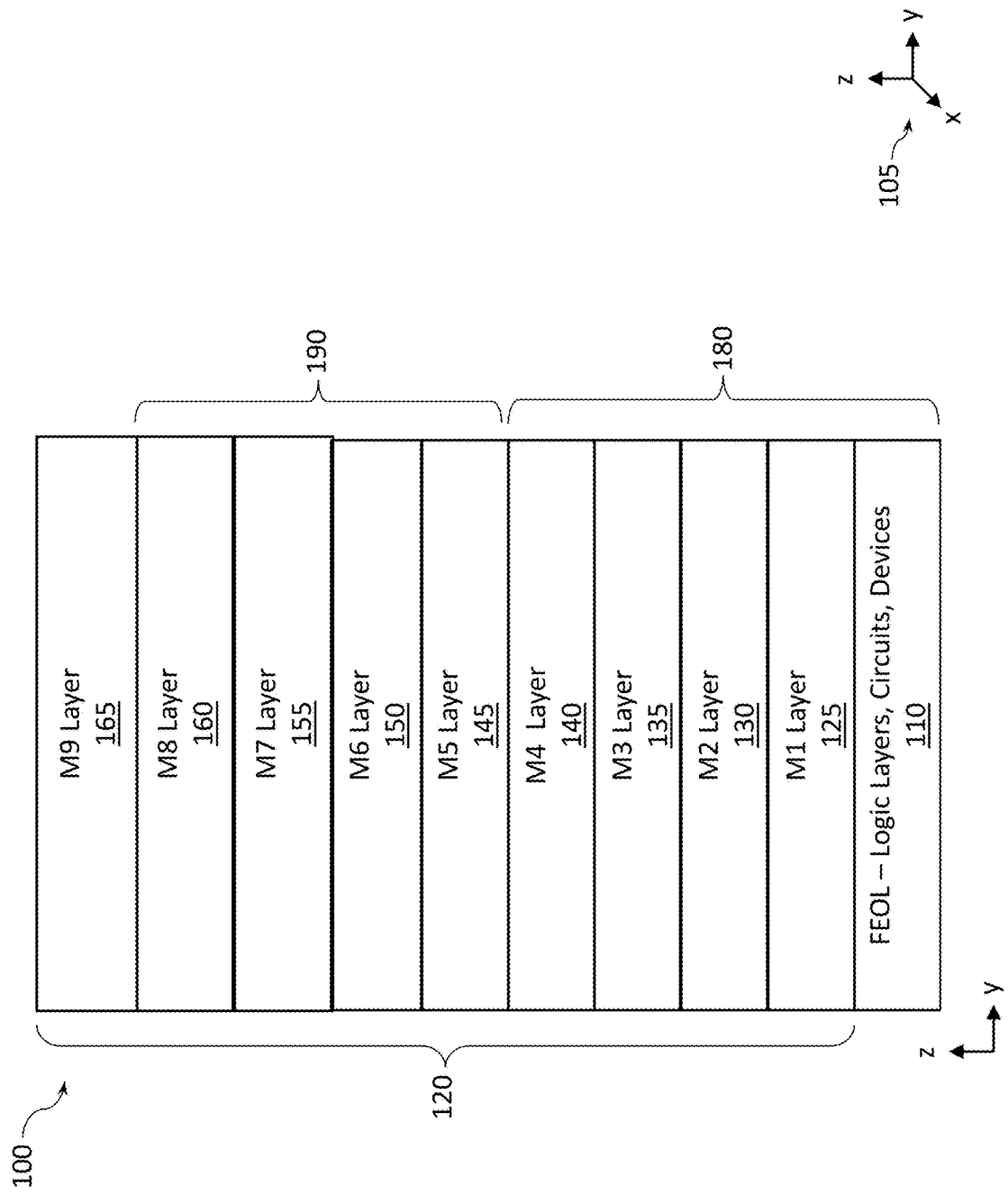
FIG. 1 is a schematic illustration of a cross-sectional view of an example integrated circuit (IC) device, according to some embodiments of the present disclosure.

SRAM may be used for particularly high-speed memory applications. The SRAM circuits are usually embedded into the same die as logic circuitry, although discrete SRAM dies can also be used. For embedded applications, SRAM may be built on the same die as the processor, where compatibility with complementary metal oxide semiconductor (CMOS) logic circuitry may allow costs to be reduced. However, a typical SRAM circuit, or a single memory cell, has six transistors (6T) and, therefore, is expensive to produce in large numbers. SRAM also requires frequent refresh cycles, which consumes power and generates heat.

As an alternative to SRAM, DRAM can be used for certain applications. DRAM is not as fast as 6T SRAM but is less expensive and requires less frequent refresh cycles. A DRAM cell stores the memory state in a capacitor and so for optimum performance DRAM is built on separate dies for which the design of the capacitor is optimized. With a separate die, the DRAM can be made using the best or lowest cost techniques available for DRAM without regard to the logic circuitry. Nevertheless, there are still high off-state leakages that limit the retention times of the corresponding memory cell. Therefore, constant refresh cycles are required to retain the state stored in the memory. The refresh cycles require power so that conventional DRAM also requires constant power and generates significant heat. In order to reduce the off-state leakage and scale down the area needed for sensing circuitry, 2T memory gain cells can be used in DRAM architectures.

Some memory devices may be considered "standalone" devices in that they are included in a chip that does not also include computing logic (e.g., transistors for performing processing operations). Other memory devices may be included in a chip along with computing logic and may be referred to as "embedded" memory devices. Using embedded memory to support computing logic may improve performance by bringing the memory and the computing logic closer together and eliminating interfaces that increase latency. Various embodiments of the present disclosure relate to both embedded and standalone memory arrays, as well as corresponding methods and devices.

A standard 2T memory cell includes two transistors which are commonly referred to as an "access transistor" and a "gain transistor." Each transistor is a three-terminal device having two source/drain (S/D) terminals and a gate terminal (in the following, the terms "terminal" and "electrode" may be used interchangeably). A first one of the two S/D terminals of an access transistor is coupled to a gate terminal of the gain transistor, while the second S/D terminal is coupled to a write bitline (WBL), and the gate terminal of the access transistor is coupled to a write wordline (WWL). A first one of the S/D terminals of the gain transistor is coupled to a read wordline (RWL) and the second one is coupled to a read bitline (RBL). A memory state, or a bit value (i.e. logical "1" or "0") of such a memory cell is represented by charge indicative of the bit value, stored in either intentional or parasitic capacitance in the so-called "storage node" between (i.e., coupled to) the gate terminal of the gain transistor and the first S/D terminal of the access transistor. An access transistor is used for programming a bit value in a 2T memory cell (i.e., writing a bit value to the memory cell by storing the charge indicative of the bit value in the storage node) and may, therefore, also be referred to as a "write transistor." A gain transistor is used for reading a 2T memory cell (i.e., determining the bit value that was stored in the memory cell) and may, therefore, also be referred as a "read transistor." Since a 2T memory cell can be fabricated with as little as two transistors, it can provide higher density and lower standby power versus SRAM in the same process technology.

Various 2T memory cells have, conventionally, been implemented with access and gain transistors being front end of line (FEOL), logic-process based, transistors implemented in an upper-most layer of a semiconductor substrate. Using standard logic transistors as access and gain transistors of a 2T memory cell creates several challenges.

One challenge relates to the leakage of such transistors, i.e., current flowing between the source and the drain of the access transistor when it is in an "off" state. Since reducing leakage of logic transistors in the scaled technology is difficult, implementing 2T memory cells in advanced technology nodes (e.g., 10 nanometer (nm), 7 nm, 5 nm, and beyond) can be challenging. In particular, given a certain transistor leakage, dimensions of a 2T memory cell should be large enough so that sufficient charge can be stored to meet the corresponding refresh times. However, continuous desire to decrease size of electronic components dictates that the macro area of memory arrays continues to decrease, placing limitations on how large the top area (i.e., the footprint) of a given memory cell is allowed to be.

Another challenge associated with the use of logic transistors in 2T memory cells relates to the distance between the first S/D electrode of the access transistor and the gate electrode of the gain transistor. Namely, using logic transistors implemented as FEOL transistors does not help reducing said distance, something that would be advantageous in terms of reducing parasitic paths and providing an improvement of retention time of 2T memory cells.

Yet another challenge resides in that, given a usable surface area of a substrate, there are only so many FEOL transistors that can be formed in that area, placing a significant limitation on the density of 2T memory cells of a memory array.

Embodiments of the present disclosure may improve on at least some of the challenges and issues described above. In contrast to the FEOL approaches described above, various embodiments of the present disclosure provide 2T memory cells, arrays, and associated methods and devices, which use TFTs as at least one of, but preferably both of, access and gain transistors of 2T memory cells. A TFT is a special kind of a field-effect transistor made by depositing a thin-film of an active semiconductor material, as well as a dielectric layer and metallic contacts, over a support layer (or, simply, a "support") that may be a non-conducting layer. At least a portion of the active semiconductor material forms a channel of the TFT. This is different from conventional, non-TFT, FEOL logic transistors where the active semiconductor channel material is typically a part of a semiconductor substrate, e.g., a part of a silicon wafer.

Using TFTs as access and gain transistors of 2T memory cells provides several advantages and enables unique architectures that were not possible with conventional, FEOL logic transistors. One advantage is that a TFT may have substantially lower leakage than a logic transistor, allowing to relax the demands related to the large charge storage placed on a 2T memory cell. In addition, both access and gain TFTs may be moved to the back end of line (BEOL) layers/stack of an advanced CMOS process, which reduces the footprint of a memory array and leaves more space for FEOL logic transistors for embedded memory applications.

Furthermore, when one or both transistors of a 2T memory cell are implemented as TFTs, these transistors may be provided in different layers above a substrate (i.e., different portions of the cell may be provided in different layers above a substrate), enabling a stacked architecture. In this context, the term "above" refers to being further away from the substrate or the FEOL of an IC device, while the term "below" refers to being closer towards the substrate or the FEOL of the IC device.

According to one aspect of the present disclosure, a 2T memory cell is provided over a substrate with TFTs used as access and gain transistors of the memory cell stacked over one another in different layers above the substrate. In particular, an example 2T memory cell includes an access TFT provided in a first layer over a substrate, and a gain TFT provided in a second layer over the substrate, the first layer being between the substrate and the second layer (i.e., the second layer is above the first layer, namely, the gain TFT is stacked in a layer above the access TFT, and, therefore, the access and gain TFTs of such a memory cell may be referred to as "stacked" TFTs).

In various embodiments, 2T memory cells using stacked TFTs may provide one of more of the following advantages.

Using two stacked TFTs instead of FEOL logic (i.e., non-thin-film) transistors, allows combining the low leakage of the access transistor, the low leakage of the gate of the gain transistor, and the elimination of parasitic paths by reducing the distance between the S/D of the access transistor and the gate of the gain transistor, which may provide an improvement of retention time of the memory cell.

In some embodiments, the first S/D electrode of the access TFT may be connected to the gate electrode of the gain TFT with a single-via process, which may be beneficial in terms of simplified manufacturing. However, there may be other architectures where the first S/D electrode of the access TFT may be connected to the gate electrode of the gain TFT by more complex means than a single-via process.

Stacking the gain transistor in a layer above the access transistor may provide advantages in terms of area efficiency and possibility to reduce unintended leakage paths for the storage node due to the reduced distance between the storage node and the gate of the gain transistor. For example, stacked, TFT based, 2T memory cell architecture as described herein may allow significantly increasing density of 2T memory cells in a memory array having a given footprint area (the footprint area being defined as an area in a plane of the substrate, or a plane parallel to the plane of the substrate, i.e., the x-y plane of an example coordinate system shown in the drawings of the present disclosure), or, conversely, allows significantly reducing the footprint area of the memory array with a given memory cell density.

Furthermore, by embedding at least some, but preferably all, of the TFT based access and gain transistors of 2T memory cells in the upper metal layers (i.e., in the BEOL layers) according to at least some embodiments of the present disclosure, the peripheral circuits that control the memory operation can be hidden below the memory area to substantially reduce the memory macro array (i.e., reduce the footprint area). Peripheral circuits of other embedded memory designs account for a large percentage of the total memory macro area, so moving the peripheral circuits below the memory array can substantially reduce the memory footprint area.

2T memory cells with stacked TFTs, described herein, may be used, for example, to address the scaling challenge of logic transistor (e.g., FEOL) based embedded DRAM (eDRAM) technology and enable high density embedded memory in an advanced CMOS process. Other technical effects will be evident from various embodiments described here.

The systems, methods and devices of this disclosure each have several innovative aspects, no single one of which is solely responsible for the all of the desirable attributes disclosed herein. Details of one or more implementations of the subject matter described in this specification are set forth in the description below and the accompanying drawings.

While some descriptions provided herein refer to 2T memory cells utilizing vertical access TFTs and bottom-gated horizontal gain TFTs, embodiments of the present disclosure are not limited to only these architectures of the individual TFTs and include access and gain TFTs for different memory cells being of various other architectures, or a mixture of different architectures. For example, in various embodiments, any of the access or gain TFTs of various layers of 2T stacked TFT based memory cells described herein may include bottom-gated TFTs, top-gated TFTs, vertical TFTs, nanowire TFTs, etc., all of which being within the scope of the present disclosure. Furthermore, using the term "stacked TFT based memory" to refer to a particular IC device that includes 2T memory cells using stacked TFTs as described herein does not preclude the IC device from including other types of devices besides memory or other types of memory cells besides 2T memory cells using stacked TFTs. For example, in some embodiments, stacked TFT based memory devices described herein may also include SRAM memory cells in any of the layers.

In the following detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. As used herein, a "logic state" (or, alternatively, a "state" or a "bit" value) of a memory cell may refer to one of a finite number of states that the cell can have, e.g., logic states "1" and "0," each state represented by a different charge, or a range of charges, stored in a storage node of the cell, while "READ" and "WRITE" memory access or operations refer to, respectively, determining/sensing a logic state of a memory cell and programming/setting a logic state of a memory cell.

If used herein, the terms "oxide," "carbide," "nitride," etc. refer to compounds containing, respectively, oxygen, carbon, nitrogen, etc., the term "high-k dielectric" refers to a material having a higher dielectric constant (k) than silicon oxide, while the term "low-k dielectric" refers to a material having a lower k than silicon oxide. The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense. For convenience, if a collection of drawings designated with different letters are present, e.g., FIGS. 4A-4B, such a collection may be referred to herein without the letters, e.g., as "FIG. 4."

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various 2T memory cell arrangements with stacked TFTs, described herein, may be implemented in, or associated with, one or more components associated with an IC or/and may be implemented between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

Example Architecture Considerations

FIG. 1 provides a schematic illustration of a cross-sectional view of an example IC device (e.g., a chip) 100, according to some embodiments of the present disclosure. FIG. 1 illustrates an example coordinate system 105 with axes x-y-z so that the various planes illustrated in FIG. 1 (and in some subsequent figures) may be described with reference to this coordinate system, e.g., the view shown in FIG. 1 is in the y-z plane, as indicated with y and z axes shown at the lower left corner of FIG. 1. The coordinate system 105 is not shown in subsequent figures in order to not clutter the drawings.

The IC device 100 may be referred to as a "stacked TFT based 2T memory cell arrangement" 100 because, as explained below, it will include TFT based 2T memory cells having different portions (e.g., access TFT and gain TFT) included at least two different layers shown in FIG. 1.

As shown in FIG. 1, the IC device 100 may include an FEOL 110 that includes most of the various logic layers, circuits, and devices to drive and control a logic IC. As also shown in FIG. 1, the IC device 100 also includes a BEOL 120 including, in the example illustration of one embodiment of the present disclosure, nine metal interconnect layers: metal 1 (M1) layer 125, metal 2 (M2) layer 130, metal 3 (M3) layer 135, metal 4 (M4) layer 140, metal 5 (M5) layer 145, metal 6 (M6) layer 150, metal 7 (M7) layer 155, metal 8 (M8) layer 160, and metal 9 (M9) layer 165. Although nine metal interconnect layers are shown in FIG. 1, in various embodiments, the IC device 100 may include any other number of two or more of such metal interconnect layers. Various metal layers of the BEOL 120 may be used to interconnect the various inputs and outputs of the FEOL 110 and, according to embodiments of the present disclosure, may be used to house different portions of 2T stacked TFT based memory cells as described herein.

Generally speaking, each of the metal layers of the BEOL 120, e.g., each of the layers M1-M9 shown in FIG. 1, may include a via portion and a trench/interconnect portion. Typically, the trench portion of a metal layer is above the via portion, which is shown in some cross-section illustration of subsequent figures but, in other embodiments, a trench portion may be provided below a via portion of any given metal layer of the BEOL 120. The trench portion of a metal layer may be configured for transferring signals and power along metal lines (also sometimes referred to as "trenches") extending in the x-y plane (e.g., in the x or y directions), while the via portion of a metal layer may be configured for transferring signals and power through metal vias extending in the z-direction, e.g., to any of the adjacent metal layers above or below. Accordingly, vias connect metal structures (e.g., metal lines or vias) from one metal layer to metal structures of an adjacent metal layer. While referred to as "metal" layers, various layers of the BEOL 120, e.g., layers M1-M9 shown in FIG. 1, include only certain patterns of conductive metals, e.g., copper (Cu) or aluminum (Al), or metal alloys, or more generally, patterns of an electrically conductive material, formed in an insulating medium such as interlayer dielectric (ILD). The insulating medium may include any suitable ILD materials such as silicon oxide, silicon nitride, aluminum oxide, and/or silicon oxynitride.

As also shown in FIG. 1, the IC device 100 may be further divided into a memory array 190 and a memory peripheral circuit 180. The memory peripheral circuit 180 may be built in the FEOL 110 and lower metal layers of the BEOL 120, e.g., M1-M4 layers, to control (e.g., access (read/write), store, refresh) the memory cells of the memory array 190. The memory array 190 may include 2T memory cells using stacked TFTs described herein, built in higher metal layers of the BEOL 120, e.g., in M5-M9 layers. As such, the memory array 190 may include low leakage access and gain TFTs, capacitors, as well as wordlines and bitlines, making up 2T memory cells with stacked TFTs as described in greater detail below.

Compared to other memory designs that locate a memory control circuit in the same layers as a memory array but in a different macro (or x-y) area of the IC than the memory array (such as at a periphery of the memory array), the IC device 100 may advantageously locate the memory peripheral circuit 180 below the memory array 190 (e.g., substantially in the same x-y area), thus saving valuable x-y area in the finished IC. In further detail, the IC device 100 may embed stacked TFT based 2T memory cells in various higher metal layers, e.g., M5, M6, M7, M8, and M9 layers shown in FIG. 1. For example, the M5-M7 layers can contain access TFTs of one or more of a plurality of 2T memory cells, while the M7-M9 layers can contain gain TFTs of one or more of a plurality of 2T memory cells. In various embodiments, bitlines and wordlines coupled to the access and/or gain TFTs of different memory cells may be provided in the same or different metal layers as such TFTs.

In other embodiments of the IC device 100, the memory peripheral circuit 180 and the memory array 190 may occupy other number and/or other metal layers in the BEOL 120 than what is shown in the example of FIG. 1. In still other embodiments of the IC device 100, at least portions of the memory peripheral circuit 180 and the memory array 190 may occupy one or more of the same metal layers in the BEOL 120. In some embodiments of the IC device 100, the memory peripheral circuit 180 and the memory array 190 may be provided in the same one or more metal layers in the BEOL 120.

In some embodiments, various terminals of the access and gain TFTs in different memory cells in a given row or column may be connected to continuous metal lines below, such as copper (Cu)-based metal lines, which may provide much lower resistance compared to metal lines formed in the lower (e.g., FEOL) portions of the IC device 100. The continuous metal lines may be used as the write wordlines (WWL), read wordlines (RWL), write bitlines (WBL), and/or read bitlines (RBL) of the memory array 190, and may be covered by diffusion barriers or diffusion barrier layers including dielectric layers, such as silicon nitride, silicon carbide, or the like, with vias filled with metal-diffusion barrier films like tantalum nitride (TaN), tantalum (Ta), titanium zirconium nitride (e.g., $Ti_xZr_{1-x}N$, such as X=0.53), titanium nitride (e.g., TiN), titanium tungsten (TiW), or the like. A metal layer may cover the diffusion barrier film-filled vias, which electrically connect the copper (Cu) lines to the respective terminals of the access and gain TFTs, the diffusion barrier film preventing or helping to prevent the diffusion or migration of copper (Cu) from the lines to the rest of the IC device 100. Active thin-film layers (e.g., indium gallium zinc oxide (IGZO)), forming a channel layer of each of an access TFT and a gain TFT, and other terminals of the access and gain TFTs above the thin-film layer may use a metal layer above. The space between the source and drain terminals determines the gate length of a given TFT.

Figure 2:
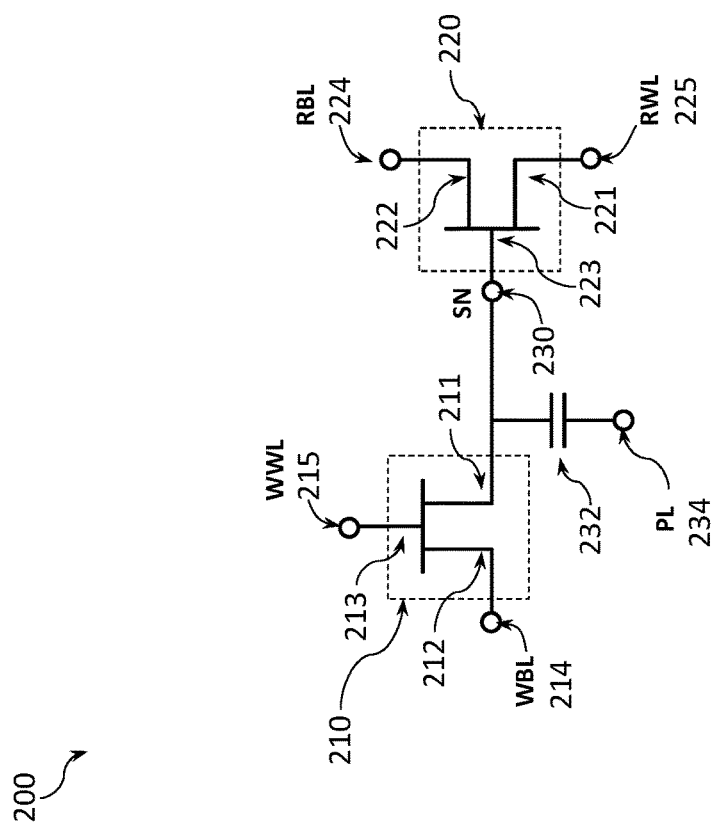
FIG. 2 is a schematic illustration of an example configuration of a two transistor (2T) memory cell with two stacked thin-film transistors (TFTs), according to some embodiments of the present disclosure.

FIG. 2 is a schematic illustration of an example configuration of a 2T memory cell 200 with two stacked TFTs, according to some embodiments of the present disclosure. As shown in FIG. 2, the memory cell 200 includes a first transistor 210 and a second transistor 220. Each of the first and second transistors 210, 220 may be implemented as a TFT. Further, the second transistor 220 may be provided in a BEOL layer above the first transistor 210, thus realizing stacked architecture, shown in greater detail in the cross-sectional illustrations of FIG. 4.

As shown in FIG. 2, the first transistor 210 includes a first S/D electrode 211, a second S/D electrode 212, and a gate electrode 213, and, similarly, the second transistor 220 includes a first S/D electrode 221, a second S/D electrode 222, and a gate electrode 223. As further shown in FIG. 2, the first S/D electrode 211 of the first transistor 210 is coupled to the gate electrode 223 of the second transistor 220, via a storage node 230; the second S/D electrode 212 of the first transistor 210 is coupled to a write bitline (WBL) 214; the gate electrode 213 of the first transistor 210 is coupled to a write wordline (WWL) 215; the first S/D electrode 221 of the second transistor 220 is coupled to a read wordline (RWL) 225; the second S/D electrode 222 of the second transistor 220 is coupled to a read bitline (RBL) 224. Thus, the first transistor 210 is an access transistor, and the second transistor 220 is a gain transistor.

A memory state, or a bit value (i.e. logical "1" or "0") of the memory cell 200 may be represented by charge indicative of the bit value, stored in the parasitic capacitance of the storage node 230 between (i.e., coupled to) the gate electrode 223 of the gain transistor 220 and the first S/D electrode 211 of the access transistor 210. FIG. 2 further illustrates that, in some embodiments, the memory cell 200 may further include an optional capacitor 232 which may also be used for storing charge representative of the bit value, i.e., in some embodiments of the memory cell 200, the capacitor 232 may be used as a storage node instead of, or in addition to, the storage node 230, where the capacitance on the capacitor 232 is indicative of the memory state of the memory cell 200. The capacitor 232 may have a first capacitor electrode coupled to the first electrode 211 of the access transistor 210 and/or to the storage node 230, and having a second capacitor electrode coupled to a capacitor plate line (PL) 234. In some embodiments, the capacitor 232 may be implemented as a three-dimensional metal-insulator-metal (MIM) capacitor.

As is commonly known, source and drain terminals are interchangeable in transistors (hence, the notation "S/D" terminals is sometimes used, indicating the interchangeability of the source and drain terminals). Therefore, while some examples and illustrations may be presented here with reference to the first S/D electrode 211 of the access transistor 210 and the first S/D electrode 221 of the gain transistor 220 being respective source terminals, and the second S/D electrode 212 of the access transistor 210 and the second S/D electrode 222 of the gain transistor 220 being respective drain terminals, in other embodiments, any of S/D terminals of the access and/or gain transistors may be reversed.

Figure 3:
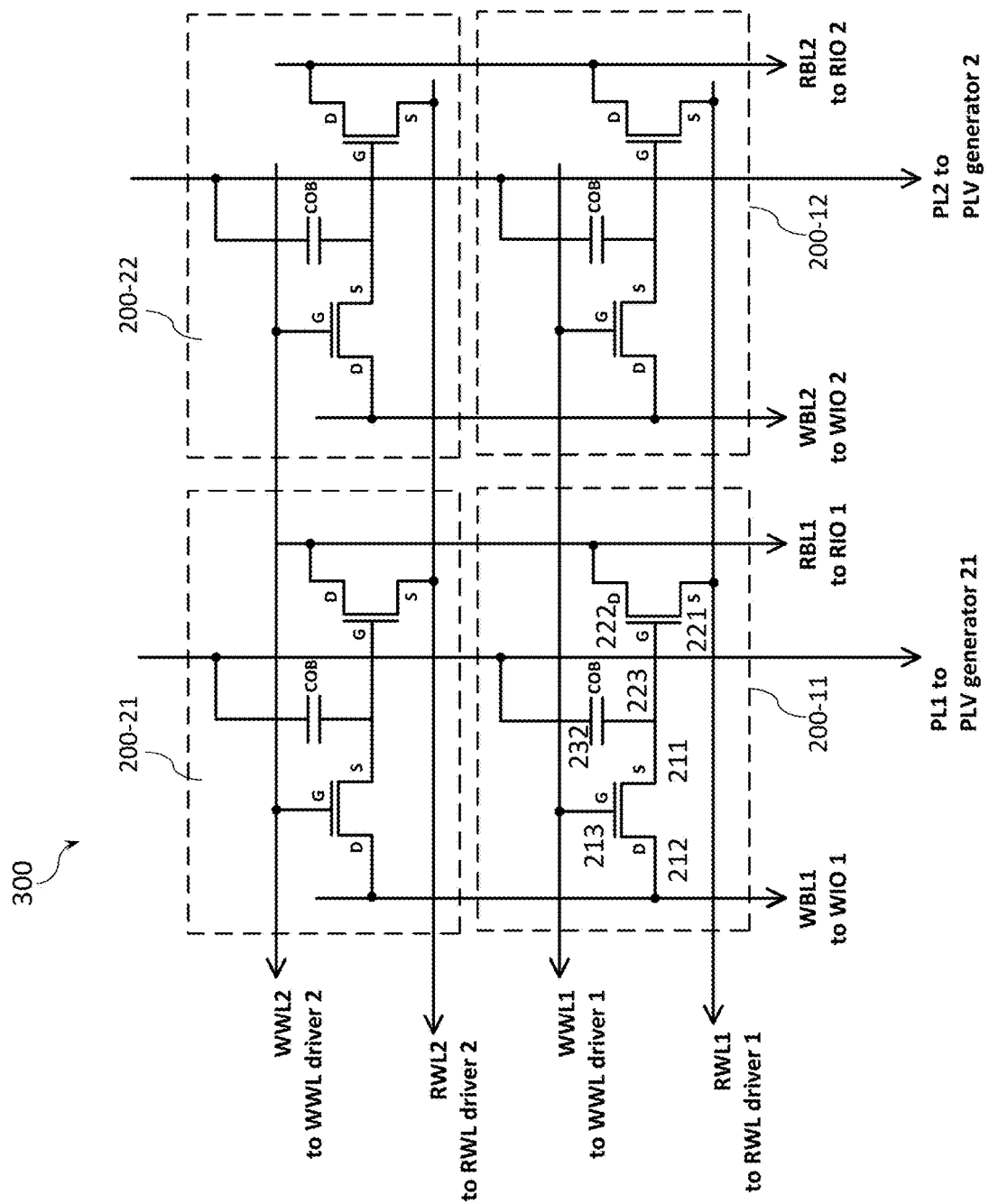
FIG. 3 is a schematic illustration of an example configuration of a memory array implementing a plurality of 2T memory cells having two stacked TFTs, according to some embodiments of the present disclosure.

FIG. 3 is a schematic illustration of an example configuration of a memory array 300 implementing a plurality of 2T memory cells having two stacked TFTs, i.e., implementing a plurality of the memory cells 200, according to some embodiments of the present disclosure. The memory array 300 may be an example implementation of the memory array 190 of the IC device 100. FIG. 3 illustrates a plurality of the memory cells 200 as described above, arranged in rows and columns, where different instances of the memory cell 200 as described above is shown in FIG. 3 as memory cells 200-11, 200-12, 200-21, and 200-22. As shown in FIG. 3, the memory cells 200-11 and 200-12 may be seen as forming a first row, the memory cells 200-21 and 200-22 may be seen as forming a second row, the memory cells 200-11 and 200-21 may be seen as forming a first column, and the memory cells 200-12 and 200-22 may be seen as forming a second column. The individual terminals of the access transistor 210 and the gain transistor 220, and the optional capacitor 232 are labeled with reference numerals only for the memory cell 200-11 but not for the other memory cells 200 shown in FIG. 3 in order to not clutter the drawing. For the other memory cells, example designation of transistor terminals is only shown with labels "S" (source terminal), "D" (drain terminal), and "G" (gate terminal), and the optional capacitor 232 is shown with a label "COB." For all memory cells of the memory array 300, descriptions provided with respect to the memory cell 200 FIG. 2 are applicable and, in the interests of brevity, are not repeated here.

FIG. 3 further illustrates that, in various embodiments, some terminals of the access and gain transistors of some memory cells 200 within the memory array 300 may be coupled to common/shared wordlines or bitlines, different instances of which will now be described.

In some embodiments, the gate terminals of the access transistors of memory cells of a given row may be coupled to a common write wordline, as shown in FIG. 3 with the gate terminals of the access transistors of the memory cells 200-11 and 200-12 of the first row being coupled to a common first write wordline (WWL1), which may then be coupled to a first WWL driver (WWL driver 1), and as further shown in FIG. 3 with the gate terminals of the access transistors of the memory cells 200-21 and 200-22 of the second row being coupled to a common second write wordline (WWL2), which may then be coupled to a second WWL driver (WWL driver 2). Thus, WWL1 shown in the memory array 300 of FIG. 3 is an example of the WWL 215 shown in FIG. 2 for each of the memory cells 200-11 and 200-12, while WWL2 shown in the memory array 300 of FIG. 3 is an example of the WWL 215 shown in FIG. 2 for each of the memory cells 200-21 and 200-22.

In some embodiments, the source terminals of the gain transistors of memory cells of a given row may be coupled to a common read wordline, as shown in FIG. 3 with the source terminals of the gain transistors of the memory cells 200-11 and 200-12 of the first row being coupled to a common first read wordline (RWL1), which may then be coupled to a first RWL driver (RWL driver 1), and as further shown in FIG. 3 with the source terminals of the gain transistors of the memory cells 200-21 and 200-22 of the second row being coupled to a common second read wordline (RWL2), which may then be coupled to a second RWL driver (RWL driver 2). Thus, RWL1 shown in the memory array 300 of FIG. 3 is an example of the RWL 225 shown in FIG. 2 for each of the memory cells 200-11 and 200-12, while RWL2 shown in the memory array 300 of FIG. 3 is an example of the RWL 225 shown in FIG. 2 for each of the memory cells 200-21 and 200-22.

In some embodiments, the drain terminals of the access transistors of memory cells of a given column may be coupled to a common write bitline, as shown in FIG. 3 with the drain terminals of the access transistors of the memory cells 200-11 and 200-21 of the first column being coupled to a common first write bitline (WBL1), which may then be coupled to a first input/output (IO) circuit (WIO 1), and as further shown in FIG. 3 with the drain terminals of the access transistors of the memory cells 200-12 and 200-22 of the second column being coupled to a common second write bitline (WBL2), which may then be coupled to a second 10 circuit (WIO 2). Thus, WBL1 shown in the memory array 300 of FIG. 3 is an example of the WBL 214 shown in FIG. 2 for each of the memory cells 200-11 and 200-21, while WBL2 shown in the memory array 300 of FIG. 3 is an example of the WBL 214 shown in FIG. 2 for each of the memory cells 200-12 and 200-22.

In some embodiments, the drain terminals of the gain transistors of memory cells of a given column may be coupled to a common read bitline, as shown in FIG. 3 with the drain terminals of the gain transistors of the memory cells 200-11 and 200-21 of the first column being coupled to a common first read bitline (RBL1), which may then be coupled to a first IO circuit (RIO 1), e.g., a sense amplifier, and as further shown in FIG. 3 with the drain terminals of the gain transistors of the memory cells 200-12 and 200-22 of the second column being coupled to a common second read bitline (RBL2), which may then be coupled to a second 10 circuit (RIO 2), e.g., a sense amplifier. Thus, RBL1 shown in the memory array 300 of FIG. 3 is an example of the RBL 224 shown in FIG. 2 for each of the memory cells 200-11 and 200-21, while RBL2 shown in the memory array 300 of FIG. 3 is an example of the RBL 224 shown in FIG. 2 for each of the memory cells 200-12 and 200-22.

The memory array 300 shown in FIG. 3 also illustrates that, when the optional capacitor 232 is included in the memory cells 200, the electrode of the capacitor 232 that is not coupled to the storage node of the memory cell may be coupled to a plate voltage generator line which may be shared between memory cells of a given column: FIG. 3 illustrates such capacitor electrodes of the memory cells 200-11 and 200-21 of the first column being coupled to a first plate line (PL1; also interchangeably referred to as "capacitor's top plate" or "PCT") which may then be coupled to a first PL voltage generator (PLV generator 1), and further illustrates such capacitor electrodes of the memory cells 200-12 and 200-22 of the second column being coupled to a second plate line (PL2) which may then be coupled to a second PL voltage generator (PLV generator 2). Thus, PL1 shown in the memory array 300 of FIG. 3 is an example of the PL 234 shown in FIG. 2 for each of the memory cells 200-11 and 200-21, while PL2 shown in the memory array 300 of FIG. 3 is an example of the PL 234 shown in FIG. 2 for each of the memory cells 200-12 and 200-22.

Again, as described above, the source and drain designations of the memory cells 200, now shown in FIG. 3, may be reversed in other embodiments. Furthermore, designation of "rows" and "columns" is only in terms of how different memory cells 200 of the memory array 300 may be addressed and not how the memory cells 200 are actually laid out in a given design. Of course, the number of rows and columns shown in FIG. 3 is purely illustrative, and, in other embodiments, any number of rows and columns, each containing any number of one or more memory cells 200 may be used. What cannot be seen from FIG. 3 is that each of the memory cells 200 of the memory array 300 may include two stacked TFTs that implement, respectively, access and gain transistors. In particular, the access transistors of the various memory cells 200 of the memory array 300 may be implemented in a first x-y plane over the substrate, and the gain transistors of the various memory cells 200 of the memory array 300 may be implemented in a second x-y plane over the substrate, stacked over the first plane, together forming a three-dimensional array of the memory cells 200, extending not only in the x-y plane but also extending in the z-direction because the different x-y plane arrays are stacked on top of one another, e.g., the array of the gain transistors of the different memory cells 200 of the memory array 300 is stacked over (i.e., is at a different z-height than) the array of the access transistors of the different memory cells 200 of the memory array 300. Although not specifically shown, in other embodiments, additional x-y plane arrays of additional memory cells 200, or of other devices may be stacked under or over top and bottom arrays of the memory array 300.

Figure 4B:
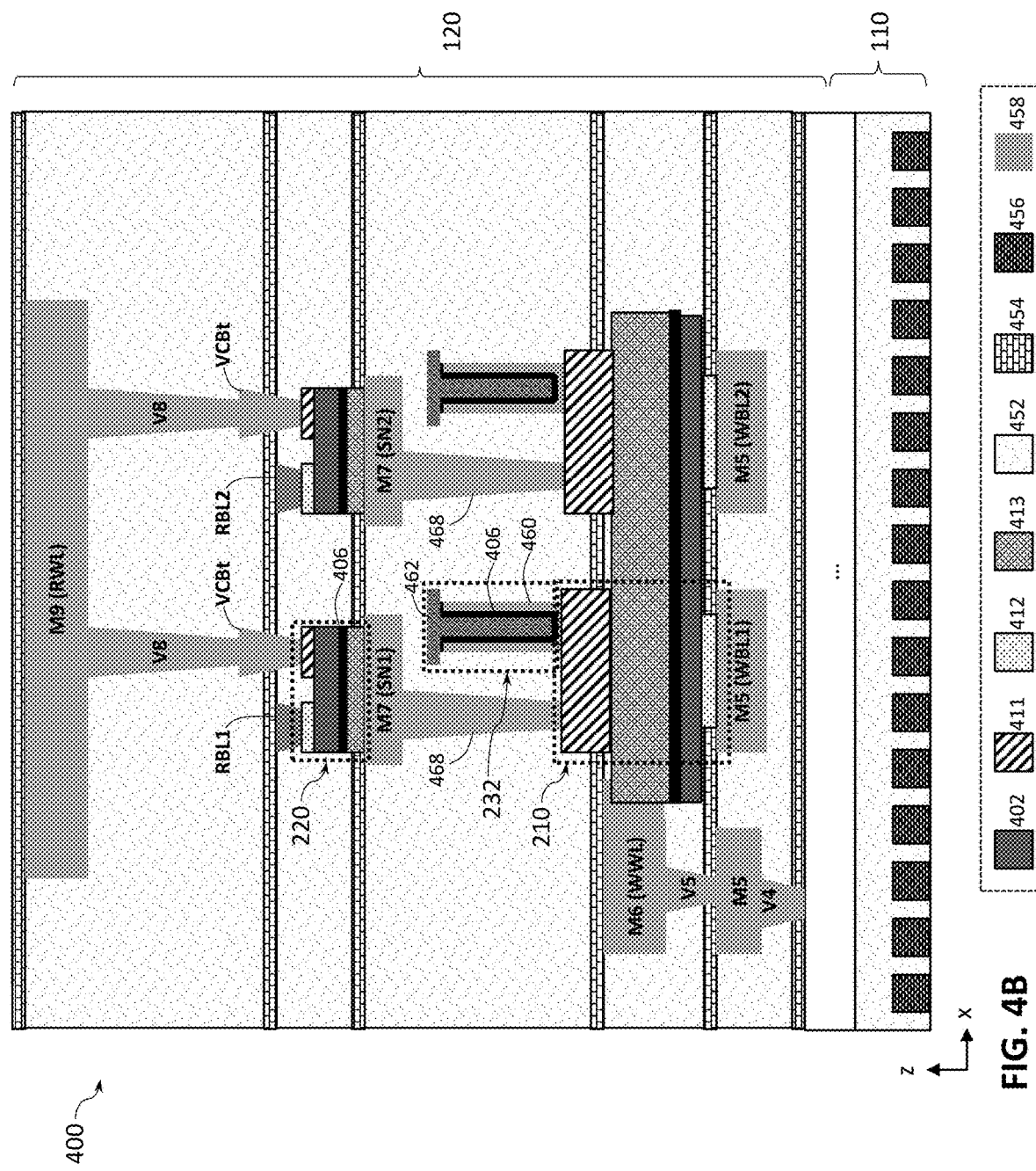

FIGS. 4A-4B are cross-sectional (y-z and x-z) views of an example IC device 400 implementing 2T memory cells using two stacked TFTs, according to some embodiments of the present disclosure. The IC device 400 is an example of the IC device 100 illustrating two examples of the memory cells 200 of the memory array 190. FIGS. 4A-4B illustrate some common/shared lines as described with reference to the memory array 300 of FIG. 3. Namely, FIG. 4A illustrates two the memory cells 200 which share a common WBL (e.g., either the memory cells 200-11 and 200-21 of the memory array 300, in which case the WBL shown in FIG. 4A is the WBL1 shown in FIG. 3, or the memory cells 200-12 and 200-22 of the memory array 300, in which case the WBL shown in FIG. 4A is the WBL2 shown in FIG. 3). On the other hand, FIG. 4B illustrates two the memory cells 200 which share a common RWL (e.g., either the memory cells 200-11 and 200-12 of the memory array 300, in which case the RWL shown in FIG. 4B is the RWL1 shown in FIG. 3, or the memory cells 200-21 and 200-22 of the memory array 300, in which case the RWL shown in FIG. 4B is the RWL2 shown in FIG. 3). In FIGS. 4A-4B, reference numerals from previous figures are intended to illustrate analogous or similar elements and, therefore, in the interests of brevity, their description is not repeated. A number of elements referred to in the description of FIGS. 4A-4B are indicated in these figures with different patterns in order to not clutter the drawings, with a legend at the bottom of such figures (enclosed in a dashed rectangle) showing the correspondence between the reference numerals and the patterns.

Both FIGS. 4A and 4B illustrate the FEOL 110 and various BEOL 120 metal layers, where the lower BEOL layers are not shown specifically (illustrating a break in the drawing between the FEOL 110 and the BEOL 120 with three dots), but only upper layers M5-M9 are shown. Reference numeral 452 shown in some of the metal layers illustrates an insulating material in which metal lines and vias for providing electrical connectivity are provided, where the insulating material 452 may be e.g., any of the ILD materials described herein, e.g., silicon oxide, silicon nitride, aluminum oxide, and/or silicon oxynitride. Each of FIGS. 4A and 4B also illustrates an etch stop layer 454 between different metal layers, example logic devices 456 provided in the FEOL 110, e.g., example FEOL transistors or other FEOL devices, and various metal interconnects 458 (labeled as M or V with a respective numeral indicating one of the layers of the BEOL 120 in which a given metal interconnect 458 is implemented, e.g. "M5" indicates a metal interconnect 458 implemented in the M5 layer of the BEOL 120, etc.).

In some embodiments, metal layers in which the memory cells 200 are located, and the associated fabrication techniques, may be customized for the stacked TFT 2T memory array 190 (versus the fabrication of these metal layers and above done outside of the memory array 190) to account for the specialized structures in the memory array 190. For instance, in some embodiments, the metal layers in which the memory cells 200 are located may use a different metal, such as titanium nitride (e.g., TiN) or tungsten (W), than the rest of the metal layers outside of the memory array 190. In some embodiments, the same metal (e.g., copper) may be used for a given metal layer for both inside and outside the memory array 190. Regardless of the choice of metal used to implement the various wordlines, bitlines, and storage nodes 230 described herein, in various embodiments, the dimensions of these structures can be further modified from those of the rest of the respective layer, e.g., to reduce capacitance of some of these structures.

Each of FIGS. 4A and 4B illustrates embodiments where the bottom TFT of the memory cells 200 (i.e., the access TFT 210 implemented in lower layers of the BEOL 120 compared to the top TFT, i.e., the gain TFT 220) is implemented as a vertical TFT, while the top TFT of the memory cells (i.e., the gain TFT 220) is implemented as a horizontal bottom-gated TFT, although other architectures for the bottom and top TFTs arranged in a stacked architecture as described herein may be possible and are within the scope of the present disclosure. In FIGS. 4A and 4B, labels showing the access TFT 210, the gain TFT 220, and the optional capacitor 232 are only shown for one of the memory cells 200, namely for the memory cell shown on the left side of each of these FIGS., in order to not clutter the drawings.

A vertical dotted line 404 shown in FIG. 4A may represent an imaginary boundary between an embodiment of components of the stacked 2T TFT memory array 190 being on one side of the line (in the example of FIG. 4A, to the right of the line 404), and components of a regular logic IC being on the other side of the line (in the example of FIG. 4A, to the left of the line 404). In other embodiments, components of a regular logic IC could be implemented under the memory array 190, i.e., in the FEOL 110 and lower BEOL 120 layers shown in FIG. 4A.

In FIG. 4A, to the right of the line 404, an example stacked TFT 2T memory array illustrates two 2T stacked TFT memory cells, e.g., the memory cells 200-11 and 200-21 of the memory array 300 described above. Each of the memory cells shown in FIG. 4A includes the access TFT 210 at the bottom and the gain TFT 220 stacked in one or more layers of the BEOL 120 above the access TFT 210. In particular, for each of the access TFTs 210, FIG. 4A illustrates the source electrode 411 implementing two different instances of the source electrode 211 shown in FIGS. 2 and 3, the drain electrode 412 implementing two different instances of the drain electrode 212 shown in FIGS. 2 and 3, and the gate electrode 413 implementing two different instances of the gate electrode 213 shown in FIGS. 2 and 3. For each of the access TFTs 210, FIG. 4A further illustrates a TFT channel material 402, and a gate dielectric 406. The patterns used for these elements for the gain TFT 220 shown in FIG. 4A are the same, indicating that the same or analogous set of materials may be used for the top and bottom TFTs of the 2T memory cells 200. Namely, for each of the gain TFTs 220, FIG. 4A illustrates the source electrode 411 implementing two different instances of the source electrode 221 shown in FIGS. 2 and 3, the drain electrode 412 implementing two different instances of the drain electrode 222 shown in FIGS. 2 and 3, the gate electrode 413 implementing two different instances of the gate electrode 223 shown in FIGS. 2 and 3, as well as the TFT channel material 402 and the gate dielectric 406.

The TFT channel material 402 may be composed of semiconductor material systems including, for example, N-type or P-type materials systems. In some embodiments, the TFT channel material 402 may include a high mobility oxide semiconductor material, such as tin oxide, antimony oxide, indium oxide, indium tin oxide, titanium oxide, zinc oxide, indium zinc oxide, IGZO, gallium oxide, titanium oxynitride, ruthenium oxide, or tungsten oxide. In general, the TFT channel material 402 may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphite, and black phosphorus, each of which may possibly be doped with one or more of gallium, indium, aluminum, fluorine, boron, phosphorus, arsenic, nitrogen, tantalum, tungsten, and magnesium, etc. In particular, the TFT channel material 402 may be formed of a thin-film material. Some such materials may be deposited at relatively low temperatures, which allows depositing them within the thermal budgets imposed on back end fabrication to avoid damaging the front end components such as the FEOL 110. In some embodiments, the TFT channel material 402 may have a thickness between about 5 and 30 nanometers, including all values and ranges therein.

The S/D electrodes of the access and gain TFTS 210, 220 may include any suitable electrically conductive material, alloy, or a stack of multiple electrically conductive materials. In some embodiments, the S/D electrodes of the access and gain TFTS 210, 220 may include one or more metals or metal alloys, with metals e.g., copper, ruthenium, palladium, platinum, cobalt, nickel, hafnium, zirconium, titanium, tantalum, and aluminum, tantalum nitride, titanium nitride, tungsten, doped silicon, doped germanium, or alloys and mixtures of these. In some embodiments, the S/D electrodes of the access and gain TFTS 210, 220 may include one or more electrically conductive alloys, oxides, or carbides of one or more metals. In some embodiments, the S/D electrodes of the access and gain TFTS 210, 220 may include a doped semiconductor, such as silicon or another semiconductor doped with an N-type dopant or a P-type dopant. Metals may provide higher conductivity, while doped semiconductors may be easier to pattern during fabrication. In some embodiments, the S/D electrodes of the access and gain TFTS 210, 220 may have a thickness (i.e., dimension measured along the z-axis of the example coordinate system shown in the figures) between about 2 nanometers and 1000 nanometers, preferably between about 2 nanometers and 100 nanometers.

The gate dielectric 406 may be provided, for each of the access and gain TFTS 210, 220, to separate (i.e., to be between) the TFT channel material 402 and the respective gate electrode 413. In various embodiments, the gate dielectric 406 may include one or more high-k dielectric materials and may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric 406 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 406 during manufacture of the access and/or gain TFTs 210, 220 to improve the quality of the gate dielectric 406. In some embodiments, the gate dielectric 406 may have a thickness between about 0.5 nanometers and 3 nanometers, including all values and ranges therein, e.g., between about 1 and 3 nanometers, or between about 1 and 2 nanometers.

In some embodiments, the gate dielectric 406 may be a multilayer gate dielectric, e.g., it may include any of the high-k dielectric materials in one layer and a layer of IGZO. In some embodiments, the gate stack (i.e., a combination of the gate dielectric 406 and the gate electrode 413) may be arranged so that the IGZO is disposed between the high-k dielectric and the TFT channel material 402. In such embodiments, the IGZO may be in contact with the TFT channel material 402, and may provide the interface between the TFT channel material 402 and the remainder of the multilayer gate dielectric 406. The IGZO may have a gallium to indium ratio of 1:1, a gallium to indium ratio greater than 1 (e.g., 2:1, 3:1, 4:1, 5:1, 6:1, 7:1, 8:1, 9:1, or 10:1), and/or a gallium to indium ratio less than 1 (e.g., 1:2, 1:3, 1:4, 1:5, 1:6, 1:7, 1:8, 1:9, or 1:10).

The gate electrode 413 may include at least one P-type work function metal or N-type work function metal, depending on whether the respective TFT is a P-type metal oxide semiconductor (PMOS) transistor or an N-type metal oxide semiconductor (NMOS) transistor. For a PMOS transistor, metals that may be used for the gate electrode 413 may include, but are not limited to, ruthenium, palladium, platinum, cobalt, nickel, and conductive metal oxides (e.g., ruthenium oxide). For an NMOS transistor, metals that may be used for the gate electrode 413 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode 413 may include a stack of two or more metal layers, where one or more metal layers are work function metal layers and at least one metal layer is a fill metal layer. Further metal layers may be included for other purposes, such as to act as a diffusion barrier layer, described below.

The example shown in FIG. 4A illustrates that the drain electrode 412 of the access transistor 210 of the memory cell 200-11 (i.e., of the access transistor 210 shown on the left side of FIG. 4A) and the drain electrode 412 of the access transistor 210 of the memory cell 200-21 (i.e., of the access transistor 210 shown on the right side of FIG. 4A) are coupled to a common WBL, e.g., the WBL1 shown in FIG. 3. In some embodiments, as shown in FIG. 4A, the common WBL may be implemented in M5 layer of the BEOL 120.

The example shown in FIG. 4A also illustrates that the source electrode 411 of the gain transistor 220 of the memory cell 200-11 (i.e., of the gain transistor 220 shown on the left side of FIG. 4A) and the source electrode 411 of the gain transistor 220 of the memory cell 200-21 (i.e., of the gain transistor 220 shown on the right side of FIG. 4A) are coupled to different respective RWL, e.g., to the RWL1 and RWL2, respectively, shown in FIG. 3. In some embodiments, as shown in FIG. 4A, each of RWL1 and RWL2 may be implemented in M9 layer of the BEOL 120.

Furthermore, in some embodiments, as shown in FIG. 4A, respective storage nodes 230 of each of the memory cell 200-11 and the memory cell 200-21, labeled in FIG. 4A as SN1 and SN2, may be implemented in M7 layer of the BEOL 120.

The example shown in FIG. 4A also illustrates that the drain electrode 412 of the gain transistor 220 of the memory cell 200-11 (i.e., of the gain transistor 220 shown on the left side of FIG. 4A) and the drain electrode 412 of the gain transistor 220 of the memory cell 200-21 (i.e., of the gain transistor 220 shown on the right side of FIG. 4A) are coupled to a common RBL, e.g., the RBL1 shown in FIG. 3. RBL is illustrated in FIG. 4A as outlined with a dashed line, to indicate that the RBL is behind the plane of drawing (i.e., it is not connected to the source electrode 411 shown in the plane of the drawing, but to the drain electrode 412 which is not seen in the view of FIG. 4A).

FIG. 4A further illustrates that the source electrode 411 of each of the access transistors 210 may be coupled to the capacitor 232, where the capacitor 232 is shown in the embodiment of FIG. 4A as a three-dimensional MIM capacitor (a particular implementation of the capacitor 232 for the embodiment of FIG. 4A) including a first capacitor electrode 460 and a second capacitor electrode 462, separated by a capacitor dielectric 464 (labeled only for one of the capacitors 232 shown in FIG. 4A in order to not clutter the drawings).

FIG. 4A also illustrates that, in some embodiments, the second capacitor electrode 462 of the capacitor 232 of the access transistor 210 of the memory cell 200-11 (i.e., the access transistor 210 shown on the left side of FIG. 4A) and the second capacitor electrode 462 of the capacitor 232 of the access transistor 210 of the memory cell 200-21 (i.e., the access transistor 210 shown on the right side of FIG. 4A) may be coupled to a common PL 466. In other words, FIG. 4A illustrates that the PLs of different memory cells can be shared in the bitline direction (i.e., PLs may be parallel to BLs and perpendicular to WLs), in line with the illustration of FIG. 3. However, embodiments of the present disclosure are not limited to such implementations of PLs and, in other embodiments (not specifically shown in the figures), the PLs of different memory cells can be shared in the wordline direction (i.e., PLs may be parallel to WLs and perpendicular to BLs).

In some embodiments, the MIM capacitor 232 may be fabricated by etching (for example, by photolithography) deep, narrow openings (e.g., trenches) in the via portion of a given metal layer, and lining the openings with a thin conductor (such as the bottom capacitor electrode 460), a thin insulator (such as the capacitor dielectric 464), and another thin conductor (such as the top capacitor electrode 462), the thin insulator insulating one thin conductor from the other thin conductor, thus forming a capacitor. In some embodiments, the MIM capacitor 232 may be fabricated in a separate process from the rest of the metal layer fabrication, e.g., to account for its large height and possibly different electrode material from the rest of the metal layer. This advantageously allows creating a relatively large capacitance in the MIM capacitor 232 by having a relatively large surface area for the terminals (e.g., the top and bottom electrodes 460, 462) separated by a relatively small amount of insulation (e.g., the dielectric 464). The three layers of the capacitor 232 may be lined within the openings by, for example, atomic level deposition (ALD). For instance, the bottom electrode 460 can be lined to a thickness of about 20-40 nanometers using a conductive material (e.g., metal, conductive metal nitride or carbide, or the like), followed by a thin dielectric 464 (to increase capacitance, for example, about 3-40 nanometers), followed by a top electrode 462 again, using metal (such as about 20-40 nanometers thick), which can be coupled to the top electrode of at least some others MIM capacitors 232, e.g., as shown in the memory array 300 of FIG. 3, using respective capacitor plates PL 234. In some embodiments, the MIM capacitor 232 can be e.g., about 300 nanometers tall (in the z-direction) in some embodiments, to provide sufficient capacitance.

For example, in one embodiment, the bottom electrode 460 of the capacitor 232 may be tantalum (Ta). In another embodiment, the bottom electrode 460 of the capacitor 232 may be titanium nitride (TiN). In some embodiments, the bottom electrode 460 of the capacitor 232 may be titanium aluminum nitride (e.g., TiAlN, where the molar amount of titanium is at least that of aluminum). In another embodiment, the bottom electrode 460 of the capacitor 232 may be tantalum aluminum carbide (TaAlC). In another embodiment, the bottom electrode 460 of the capacitor 232 may be TaN. For example, in one embodiment, the top electrode 462 of the capacitor 232 may be TiN. For example, in one embodiment, the dielectric 464 of the capacitor 232 may be silicon oxide. In some embodiments, such as to reduce tunneling (e.g., when the dielectric 464 is very thin), the dielectric 464 may be a high-K material, e.g., any of the high-k materials described above with reference to the gate dielectric 406.

Still further shown in FIG. 4A are structures labeled as "VCBt" which couple, respectively, the source electrode 411 of each of the gain transistors 220 to the respective RWL. Namely, FIG. 4A illustrates a first structure VCBt as a metal interconnect coupling the source electrode 411 of the gain transistor 220 of the memory cell 200-11 to its' respective RWL1, and further illustrates a second structure VCBt as a metal interconnect coupling the source electrode 411 of the gain transistor 220 of the memory cell 200-21 to its' respective RWL2.

FIG. 4B will now be described by only describing the differences with respect to FIG. 4A. In other words, descriptions provided for FIG. 4A are applicable to FIG. 4B, unless stated otherwise or is clear from the descriptions provided herein.

Unlike FIG. 4A, FIG. 4B illustrates the two memory cells 200 which share a common RWL. For example, consider that FIG. 4B illustrates the memory cells 200-11 and 200-12 of the memory array 300, in which case the RWL shown in FIG. 4B is the RWL1 shown in FIG. 3. Therefore, FIG. 4B illustrates that both the source electrode 411 of the gain transistor 220 of the memory cell 200-11 (i.e., the gain transistor 220 shown on the left side of FIG. 4B) and the source electrode 411 of the gain transistor 220 of the memory cell 200-12 (i.e., the gain transistor 220 shown on the right side of FIG. 4B) are coupled to a single shared RWL, e.g. the RWL1 shown in FIG. 3.

Also unlike FIG. 4A, FIG. 4B illustrates that the access transistors 210 of the two memory cells 200 have a gate electrode that is electrically continuous (i.e., shared) between the two cells, which is coupled to a common WWL, which for example, can connect to M6 layer of the BEOL 120. Therefore, FIG. 4B illustrates that the gate electrode 413 of the access transistor 210 of the memory cell 200-11 (i.e., the access transistor 210 shown on the left side of FIG. 4B) and the gate electrode 413 of the access transistor 210 of the memory cell 200-12 (i.e., the access transistor 210 shown on the right side of FIG. 4B) are electrically continuous, and may be coupled to a single shared WWL, e.g. the WWL1 shown in FIG. 3.

Further unlike FIG. 4A, FIG. 4B illustrates that the two memory cells 200 shown in that figure do not share a common RBL. Instead, the drain electrode 412 of the gain transistor 220 of the memory cell 200-11 (i.e., of the gain transistor 220 shown on the left side of FIG. 4B) is coupled to its own RBL, e.g., the RBL1 shown in FIG. 3, and the drain electrode 412 of the gain transistor 220 of the memory cell 200-12 (i.e., of the gain transistor 220 shown on the right side of FIG. 4B) is coupled to another RBL, e.g., the RBL2 shown in FIG. 3.

In addition, the second capacitor electrode 462 of the capacitor 232 of the access transistor 210 of the memory cell 200-11 (i.e., the access transistor 210 shown on the left side of FIG. 4B) and the second capacitor electrode 462 of the capacitor 232 of the access transistor 210 of the memory cell 200-12 (i.e., the access transistor 210 shown on the right side of FIG. 4B) are coupled to different PLs 466.

What can also be seen in FIG. 4B is a metal interconnect 468 coupling the source electrode 411 of the access transistor 210 with the gate electrode 413 of the gain transistor 220, for each of the two memory cells 200 shown. In some embodiments, such a metal interconnect 468 may be implemented as a deep via, as shown in FIG. 4B, forming the SN 230 for each memory cell. Because the gain transistor 220 is stacked above the access transistor 210, and because of the architecture of each of these transistors (i.e., horizontal bottom-gated and vertical, respectively), in some such embodiments, the source electrode 411 of the access transistor 210 may be coupled with the gate electrode 413 of the gain transistor 220 using a single-via process, advantageously enabling use of a relatively easy fabrication process. However, in other embodiments, the source electrode 411 of the access transistor 210 may be coupled with the gate electrode 413 of the gain transistor 220 using more complex processes than a single-via process. Furthermore, said coupling may also be performed differently if any one of, or both, the access transistor 210 and the gain transistor 220 have architecture other than the one shown in FIG. 4B. The metal interconnect 468 is not specifically shown in FIG. 4A because it is behind the plane of the drawing, but such an interconnect is present there as well, in accordance with the schematics of FIGS. 2 and 3, and all of the descriptions provided herein are, therefore, applicable to the embodiment shown in FIG. 4A.

Variations and Implementations

Various device assemblies illustrated in FIGS. 1-4 do not represent an exhaustive set of IC devices with 2T memory cells with stacked TFTs as described herein, but merely provide examples of such structures/assemblies. In particular, the number and positions of various elements shown in FIGS. 1-4 is purely illustrative and, in various other embodiments, other numbers of these elements, provided in other locations relative to one another may be used in accordance with the general architecture considerations described herein. For example, while FIG. 1 illustrates metal layers M1-M9 of the BEOL 120, in other embodiments, other number of metal layers may be included. In another example, while FIGS. 3 and 4 illustrate specific numbers of memory cells and specific number of stacked transistors (namely, two access transistors forming a bottom portion of the memory array and two gain transistors forming a top portion of the memory array, stacked over the bottom portion of the memory array), in other embodiments, any other number of memory cells may be included in an IC device implementing a three-dimensional memory array with 2T memory cells with stacked TFTs as described herein, with any number of two or more stacked x-y plane arrays of access and gain transistors.

Further, FIGS. 1-4 are intended to show relative arrangements of the elements therein, and the device assemblies of these FIGS. may include other elements that are not specifically illustrated (e.g., various interfacial layers). Similarly, although particular arrangements of materials are discussed with reference to FIGS. 1-4, intermediate materials may be included in the assemblies of these FIGS. Still further, although some elements of the various cross-sectional views are illustrated in FIG. 4 as being trapezoidal or as being planar rectangles or formed of rectangular solids, this is simply for ease of illustration, and embodiments of these assemblies may be curved, rounded, or otherwise irregularly shaped as dictated by, and sometimes inevitable due to, the manufacturing processes used to fabricate semiconductor device assemblies.

Still further, various embodiments described above illustrate specific metal layers in which various components of the memory cells 200 may be implemented. However, these descriptions are applicable to any other metal layers, where, in general, metal layers shown, e.g., in FIG. 4 may be replaced with metal layers Mx, Mx+1, and so on. In various such embodiments, implementing a 2T memory cell by using two TFTs provided in different layers above the substrate may provide various advantages described herein, e.g., benefiting from the combination of the low leakage of the access transistor and the low leakage of the gate of the gain transistor, elimination of parasitic paths by reducing the distance between the S/D electrode of the access transistor and the gate of the gain transistor, etc., all of this enabling an improvement of retention time of the 2T memory cell.

Inspection of layout and mask data and reverse engineering of parts of a device to reconstruct the circuit using e.g., optical microscopy, TEM, or SEM, and/or inspection of a cross-section of a device to detect the shape and the location of various device elements described herein using e.g., Physical Failure Analysis (PFA) would allow determination of the TFT-eDRAM memory arrays as described herein.

IC devices with 2T memory cells with stacked TFTs as described herein may be fabricated using any suitable techniques, e.g., subtractive, additive, damascene, dual damascene, etc., all of which being within the scope of the present disclosure. Some of such technique may include suitable deposition and patterning techniques. As used herein, "patterning" may refer to forming a pattern in one or more materials using any suitable techniques (e.g., applying a resist, patterning the resist using lithography, and then etching the one or more material using dry etching, wet etching, or any appropriate technique).

Example Electronic Devices

Arrangements with 2T memory cells with stacked TFTs as disclosed herein may be included in any suitable electronic device. FIGS. 5-9 illustrate various examples of devices and components that may include one or more 2T memory cells with stacked TFTs as disclosed herein.

Figure 5B:
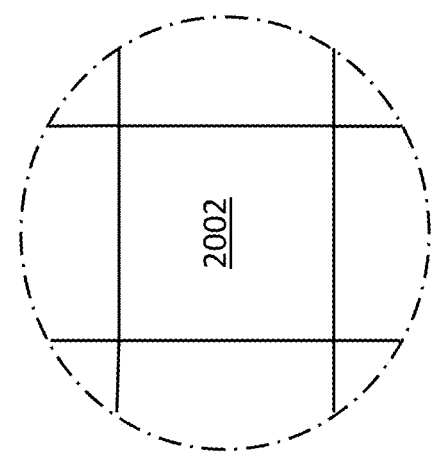
FIGS. 5A-5B are top views of a wafer and dies that include one or more memory arrays implementing 2T memory cells with stacked TFTs in accordance with any of the embodiments disclosed herein.
Figure 5A:
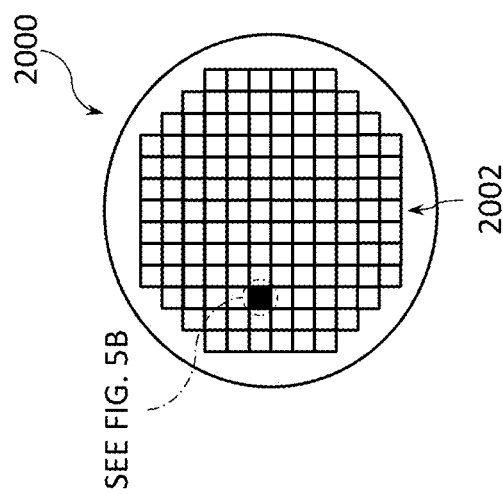

FIGS. 5A-5B are top views of a wafer 2000 and dies 2002 that may include one or more 2T memory cells with stacked TFTs in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 7. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more 2T memory cells with stacked TFTs as described herein). After the fabrication of the semiconductor product is complete (e.g., after manufacture of one or more 2T memory cells with stacked TFTs as described herein, e.g. any embodiment of the memory array 190 of the IC device 100, or any embodiments of the memory cells 200), the wafer 2000 may undergo a singulation process in which each of the dies 2002 is separated from one another to provide discrete "chips" of the semiconductor product. In particular, devices that include one or more 2T memory cells with stacked TFTs as disclosed herein may take the form of the wafer 2000 (e.g., not singulated) or the form of the die 2002 (e.g., singulated). The die 2002 may include a plurality of transistors (e.g., one or more access TFTs and one or more gain TFTs for the memory array 190 as described herein, as well as zero or more FEOL transistors 2140 of FIG. 6, discussed below) and/or supporting circuitry to route electrical signals to the transistors, as well as any other IC components. In some embodiments, the wafer 2000 or the die 2002 may implement or include a memory device (e.g., a SRAM device), a logic device (e.g., an AND, OR, NAND, or NOR gate), or any other suitable circuit element. Multiple ones of these devices may be combined on a single die 2002. For example, a memory array formed by multiple memory devices may be formed on a same die 2002 as a processing device (e.g., the processing device 2402 of FIG. 9) or other logic that is configured to store information in the memory devices or execute instructions stored in the memory array.

Figure 6:
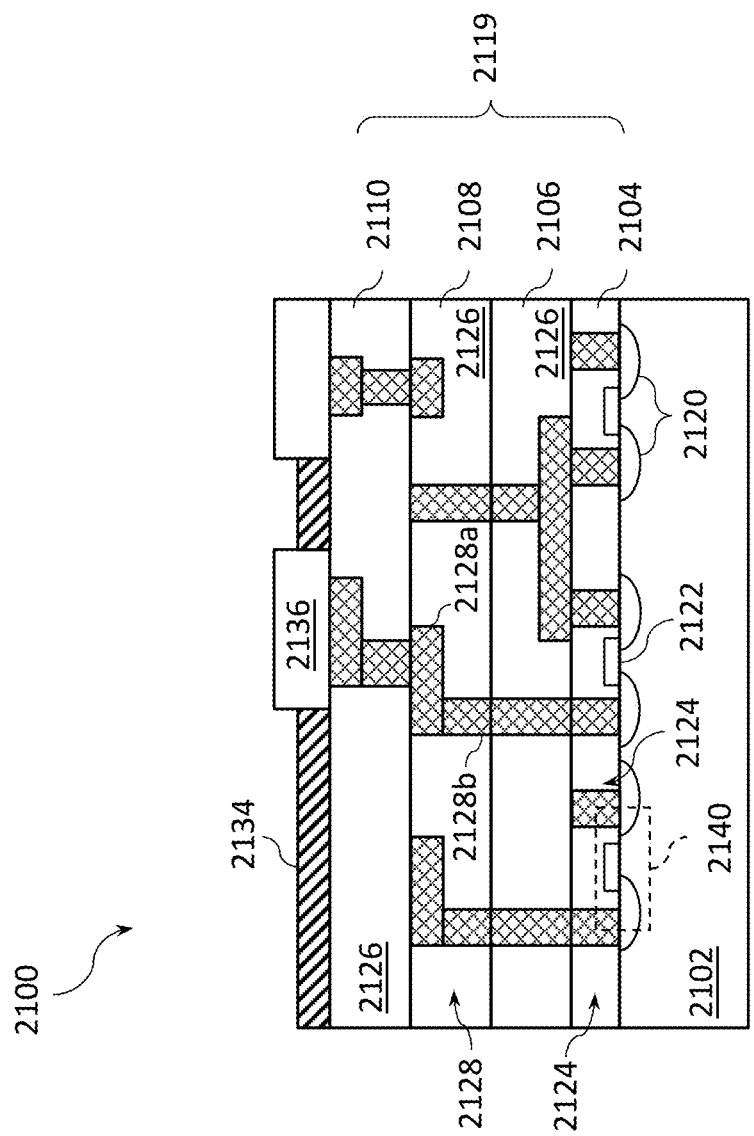
FIG. 6 is a cross-sectional side view of an IC device that may include one or more memory arrays implementing 2T memory cells with stacked TFTs in accordance with any of the embodiments disclosed herein.

FIG. 6 is a cross-sectional side view of an IC device 2100 that may include one or more 2T memory cells with stacked TFTs in accordance with any of the embodiments disclosed herein. For example, the IC device 2100 may be, or may include, the IC device 100, described above, implementing one or more memory arrays 190 which may include one or more 2T memory cells with stacked TFTs according to any embodiments described herein. In particular, different transistors of the one or more 2T memory cells with stacked TFTs as described herein may be implemented in any of the BEOL layers of the IC device 2100, e.g., in any of the interconnect layers 2106-2110 shown in FIG. 6. Because there are various possibilities where such 2T memory cells with stacked TFTs may be integrated in the IC device 2100, the 2T memory cells with stacked TFTs are not specifically shown in FIG. 6. In some embodiments, the IC device 2100 may serve as any of the dies 2256 in the IC package 2300.

As shown in FIG. 6, the IC device 2100 may be formed on a substrate 2102 (e.g., the wafer 2000 of FIG. 5A) and may be included in a die (e.g., the die 2002 of FIG. 5B). The substrate 2102 may include any material that may serve as a foundation for an IC device 2100, or, in general, as a foundation for forming one or more 2T memory cells with stacked TFTs according to any embodiments described herein. In some embodiments, the substrate 2102 may be a semiconductor substrate composed of semiconductor material systems including, for example, N-type or P-type material systems. The substrate may include, for example, a crystalline substrate formed using a bulk silicon or a silicon-on-insulator (SOI) structure. In some embodiments, the substrate 2102 may be formed using alternative materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-N or group IV materials. Further materials classified as group II-VI or group III-V may also be used to form the substrate 2102 on which logic devices, e.g., the FEOL devices 456 as shown in FIG. 4, e.g., the transistors 2140 as shown in FIG. 6, may be formed. In some embodiments, the substrate 2102 may be non-crystalline. In some embodiments, the substrate 2102 may be a printed circuit board (PCB) substrate. Although a few examples of the substrate 2102 are described here, any material or structure that may serve as a foundation upon which an IC device 2100 may be built falls within the spirit and scope of the present disclosure. The substrate 2102 may be part of a singulated die (e.g., the die 2002 of FIG. 5B) or a wafer (e.g., the wafer 2000 of FIG. 5A).

The IC device 2100 may include one or more device layers 2104 disposed on the substrate 2102. The device layer 2104 may include features of one or more transistors 2140 (e.g., metal oxide semiconductor field-effect transistors (MOSFETs)) formed on the substrate 2102. The device layer 2104 may include, for example, one or more S/D regions 2120, a gate 2122 to control current flow in the transistors 2140 between the S/D regions 2120, and one or more S/D contacts 2124 to route electrical signals to/from the S/D regions 2120. The transistors 2140 may include additional features not depicted for the sake of clarity, such as device isolation regions, gate contacts, and the like.

Each transistor 2140 may include a gate 2122 formed of at least two layers, a gate dielectric layer and a gate electrode layer. Generally, the gate dielectric layer of a transistor 2140 may include one layer or a stack of layers, and may include any of the materials described above with reference to the gate dielectric 406. In some embodiments, an annealing process may be carried out on the gate dielectric of the gate 2122 to improve its quality when a high-k material is used.

The gate electrode may be formed on the gate dielectric and may include at least one P-type work function metal or N-type work function metal, depending on whether the transistor 2140 is to be a PMOS or an NMOS transistor. In some implementations, the gate electrode may include a stack of two or more metal layers, where one or more metal layers are work function metal layers and at least one metal layer is a fill metal layer. Further metal layers may be included for other purposes, such as a barrier layer. The gate electrode of the gate 2122 may include any of the materials described above with reference to the gate electrode 413.

In some embodiments, when viewed as a cross-section of the transistor 2140 along the source-channel-drain direction, the gate electrode of the gate 2122 may include a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may include a combination of U-shaped structures and planar, non-U-shaped structures. For example, the gate electrode may include one or more U-shaped metal layers formed atop one or more planar, non-U-shaped layers. In some embodiments, the gate electrode may include a V-shaped structure (e.g., when the fin of a FinFET does not have a "flat" upper surface, but instead has a rounded peak).

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 2120 may be formed within the substrate 2102, e.g., adjacent to the gate of each transistor 2140. The S/D regions 2120 may be formed using an implantation/diffusion process or an etching/deposition process, for example. In the former process, dopants such as boron, aluminum, antimony, phosphorous, or arsenic may be ion-implanted into the substrate 2102 to form the S/D regions 2120. An annealing process that activates the dopants and causes them to diffuse farther into the substrate 2102 may follow the ion-implantation process. In the latter process, the substrate 2102 may first be etched to form recesses at the locations of the S/D regions 2120. An epitaxial deposition process may then be carried out to fill the recesses with material that is used to fabricate the S/D regions 2120. In some implementations, the S/D regions 2120 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 2120 may be formed using one or more alternate semiconductor materials such as germanium or a group III-V material or alloy. In further embodiments, one or more layers of metal and/or metal alloys may be used to form the S/D regions 2120.

Various transistors 2140 are not limited to the type and configuration depicted in FIG. 6 and may include a wide variety of other types and configurations such as, for example, planar transistors, non-planar transistors (e.g., FinFETs, nanowire, or nanoribbon transistors), or a combination of both.

Electrical signals, such as power and/or IO signals, may be routed to and/or from the transistors 2140 of the device layer 2104 through one or more interconnect layers disposed on the device layer 2104 (illustrated in FIG. 6 as interconnect layers 2106-2110). For example, electrically conductive features of the device layer 2104 (e.g., the gate 2122 and the S/D contacts 2124) may be electrically coupled with the interconnect structures 2128 of the interconnect layers 2106-2110. The one or more interconnect layers 2106-2110 may form an ILD stack 2119 of the IC device 2100.

The interconnect structures 2128 may be arranged within the interconnect layers 2106-1210 to route electrical signals according to a wide variety of designs (in particular, the arrangement is not limited to the particular configuration of interconnect structures 2128 depicted in FIG. 6). Although a particular number of interconnect layers 2106-1210 is depicted in FIG. 6, embodiments of the present disclosure include IC devices having more or fewer interconnect layers than depicted.

In some embodiments, the interconnect structures 2128 may include trench structures 2125A (sometimes referred to as "lines") and/or via structures 2125B (sometimes referred to as "holes") filled with an electrically conductive material such as a metal. The trench structures 2125A may be arranged to route electrical signals in a direction of a plane that is substantially parallel with a surface of the substrate 2102 upon which the device layer 2104 is formed. For example, the trench structures 2125A may route electrical signals in a direction in and out of the page from the perspective of FIG. 6. The via structures 2125B may be arranged to route electrical signals in a direction of a plane that is substantially perpendicular to the surface of the substrate 2102 upon which the device layer 2104 is formed. In some embodiments, the via structures 2125B may electrically couple trench structures 2125A of different interconnect layers 2106-2110 together.

The interconnect layers 2106-2110 may include a dielectric material 2126 disposed between the interconnect structures 2128, as shown in FIG. 6. In some embodiments, the dielectric material 2126 disposed between the interconnect structures 2128 in different ones of the interconnect layers 2106-2110 may have different compositions; in other embodiments, the composition of the dielectric material 2126 between different interconnect layers 2106-2110 may be the same. The dielectric material 2126 may include any of the materials described above with reference to the dielectric material 252.

A first interconnect layer 2106 (referred to as Metal 1 or "M1") may be formed directly on the device layer 2104. In some embodiments, the first interconnect layer 2106 may include trench structures 2125A and/or via structures 2125B, as shown. The trench structures 2125A of the first interconnect layer 2106 may be coupled with contacts (e.g., the S/D contacts 2124) of the device layer 2104.

A second interconnect layer 2108 (referred to as Metal 2 or "M2") may be formed directly on the first interconnect layer 2106. In some embodiments, the second interconnect layer 2108 may include via structures 2125B to couple the trench structures 2125A of the second interconnect layer 2108 with the trench structures 2125A of the first interconnect layer 2106. Although the trench structures 2125A and the via structures 2125B are structurally delineated with a line within each interconnect layer (e.g., within the second interconnect layer 2108) for the sake of clarity, the trench structures 2125A and the via structures 2125B may be structurally and/or materially contiguous (e.g., simultaneously filled during a dual damascene process) in some embodiments.

A third interconnect layer 2110 (referred to as Metal 3 or "M3") (and additional interconnect layers, as desired) may be formed in succession on the second interconnect layer 2108 according to similar techniques and configurations described in connection with the second interconnect layer 2108 or the first interconnect layer 2106.

The interconnect layers 2106-2110 may be the metal layers M1-M3, described above and shown in FIG. 1. Although not specifically shown in FIG. 6, further metal layers may be present in the IC device 2100, e.g., the metal layers M4-M9 as described above and shown, e.g., in FIGS. 1 and 4.

The IC device 2100 may include a solder resist material 2134 (e.g., polyimide or similar material) and one or more bond pads 2136 formed above the top interconnect layers of the IC device, e.g. over the metal layer M9 shown in FIGS. 1 and 4. The bond pads 2136 may be electrically coupled with the interconnect structures 2128 and configured to route the electrical signals of the transistor(s) 2140 to other external devices. For example, solder bonds may be formed on the one or more bond pads 2136 to mechanically and/or electrically couple a chip including the IC device 2100 with another component (e.g., a circuit board). The IC device 2100 may have other alternative configurations to route the electrical signals from the interconnect layers 2106-2110 than depicted in other embodiments. For example, the bond pads 2136 may be replaced by or may further include other analogous features (e.g., posts) that route the electrical signals to external components.

Figure 7:
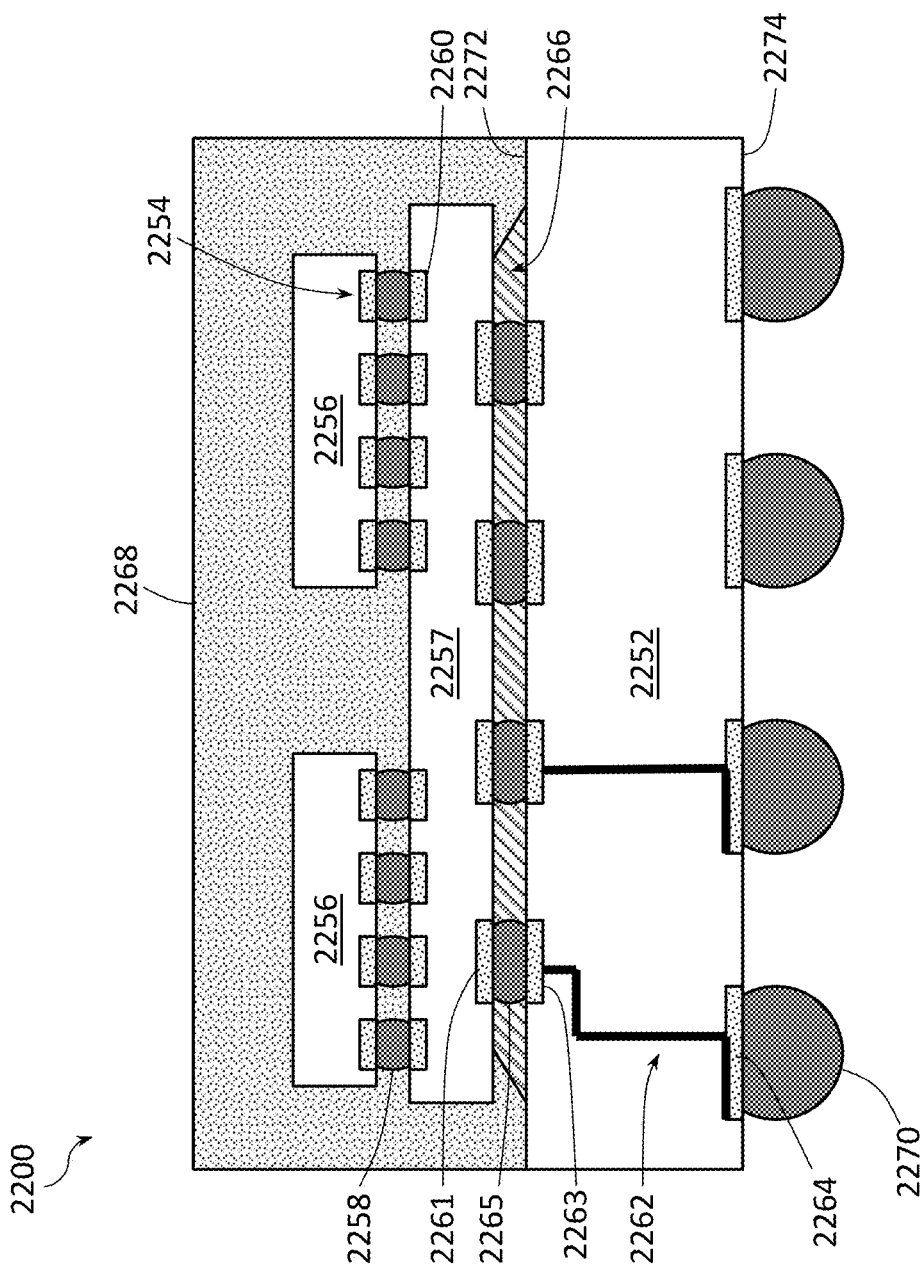
FIG. 7 is a cross-sectional side view of an IC package that may include one or more memory arrays implementing 2T memory cells with stacked TFTs in accordance with any of the embodiments disclosed herein.

FIG. 7 is a side, cross-sectional view of an example IC package 2200 that may include one or more 2T memory cells with stacked TFTs in accordance with any of the embodiments disclosed herein. In some embodiments, the IC package 2200 may be a system-in-package (SiP).

The package substrate 2252 may be formed of a dielectric material (e.g., a ceramic, a buildup film, an epoxy film having filler particles therein, etc.), and may have conductive pathways extending through the dielectric material between the face 2272 and the face 2274, or between different locations on the face 2272, and/or between different locations on the face 2274. These conductive pathways may take the form of any of the interconnect structures 2128 discussed above with reference to FIG. 6.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 7 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 7 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 7 are solder balls (e.g., for a ball grid array arrangement), but any suitable second-level interconnects 2270 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 8.

The dies 2256 may take the form of any of the embodiments of the die 2002 discussed herein (e.g., may include any of the embodiments of the IC device 100 of FIG. 1, the IC device 400 of FIG. 4, the IC device 2100 of FIG. 6, or any combination of these IC devices). In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be logic dies (e.g., silicon-based dies), and one or more of the dies 2256 may be memory dies (e.g., high bandwidth memory), including dies with the IC devices as described herein. In some embodiments, any of the dies 2256 may include one or more 2T memory cells with stacked TFTs, e.g., as discussed above; in some embodiments, at least some of the dies 2256 may not include any 2T memory cells with stacked TFTs.

The IC package 2200 illustrated in FIG. 7 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 7, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 8:
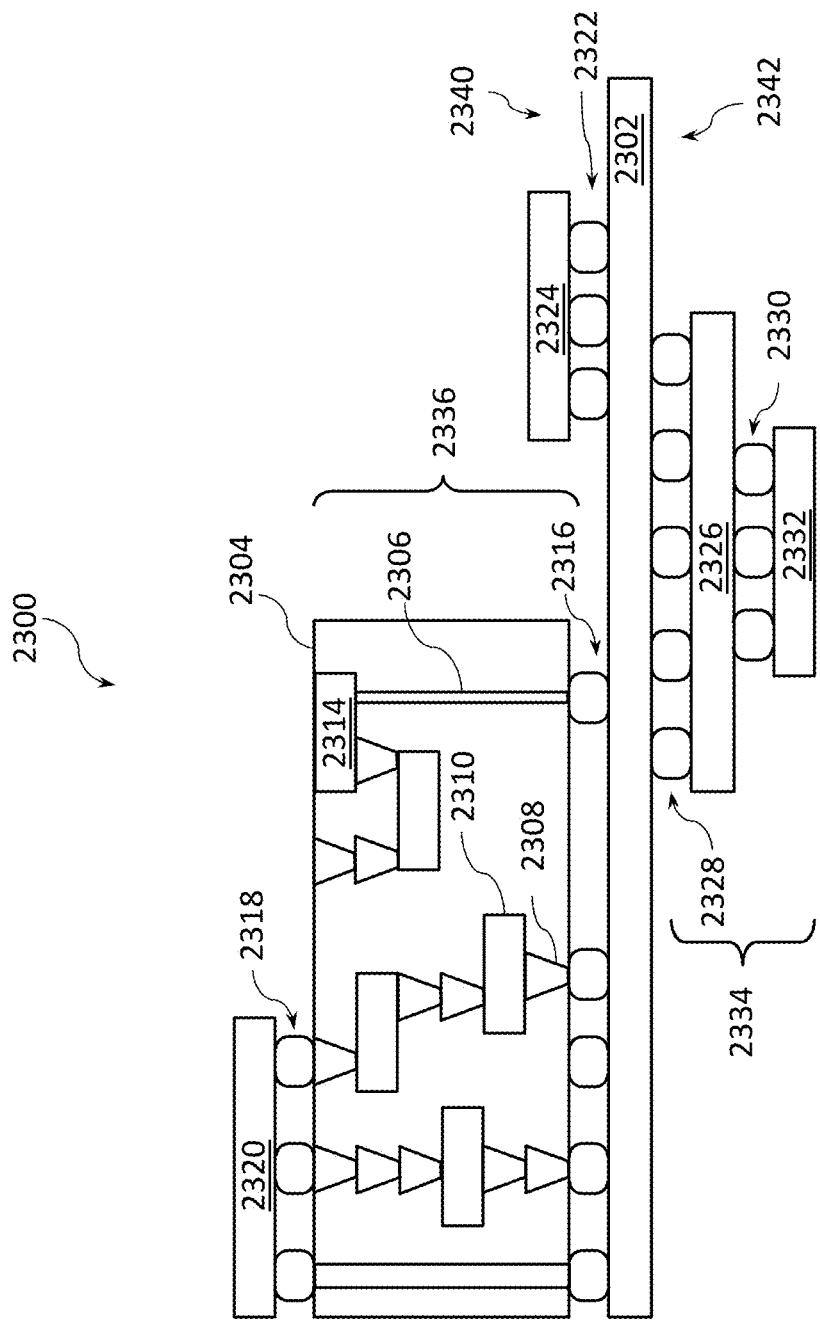
FIG. 8 is a cross-sectional side view of an IC device assembly that may include one or more memory arrays implementing 2T memory cells with stacked TFTs in accordance with any of the embodiments disclosed herein.

FIG. 8 is a cross-sectional side view of an IC device assembly 2300 that may include components having one or more 2T memory cells with stacked TFTs in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of one or more 2T memory cells with stacked TFTs in accordance with any of the embodiments disclosed herein; e.g., any of the IC packages discussed below with reference to the IC device assembly 2300 may take the form of any of the embodiments of the IC package 2200 discussed above with reference to FIG. 7 (e.g., may include one or more 2T memory cells with stacked TFTs provided on a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 8 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 8), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 5B), an IC device (e.g., the IC device 100 of FIG. 1, the IC device 400 of FIG. 4, the IC device 2100 of FIG. 6, or any combination of these IC devices), or any other suitable component. In particular, the IC package 2320 may include one or more 2T memory cells with stacked TFTs as described herein. Although a single IC package 2320 is shown in FIG. 8, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 8, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as radio frequency (RF) devices, power amplifiers, power management devices, antennas, arrays, sensors, and microelectromechanical systems (MEMS) devices may also be formed on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 8 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 9:
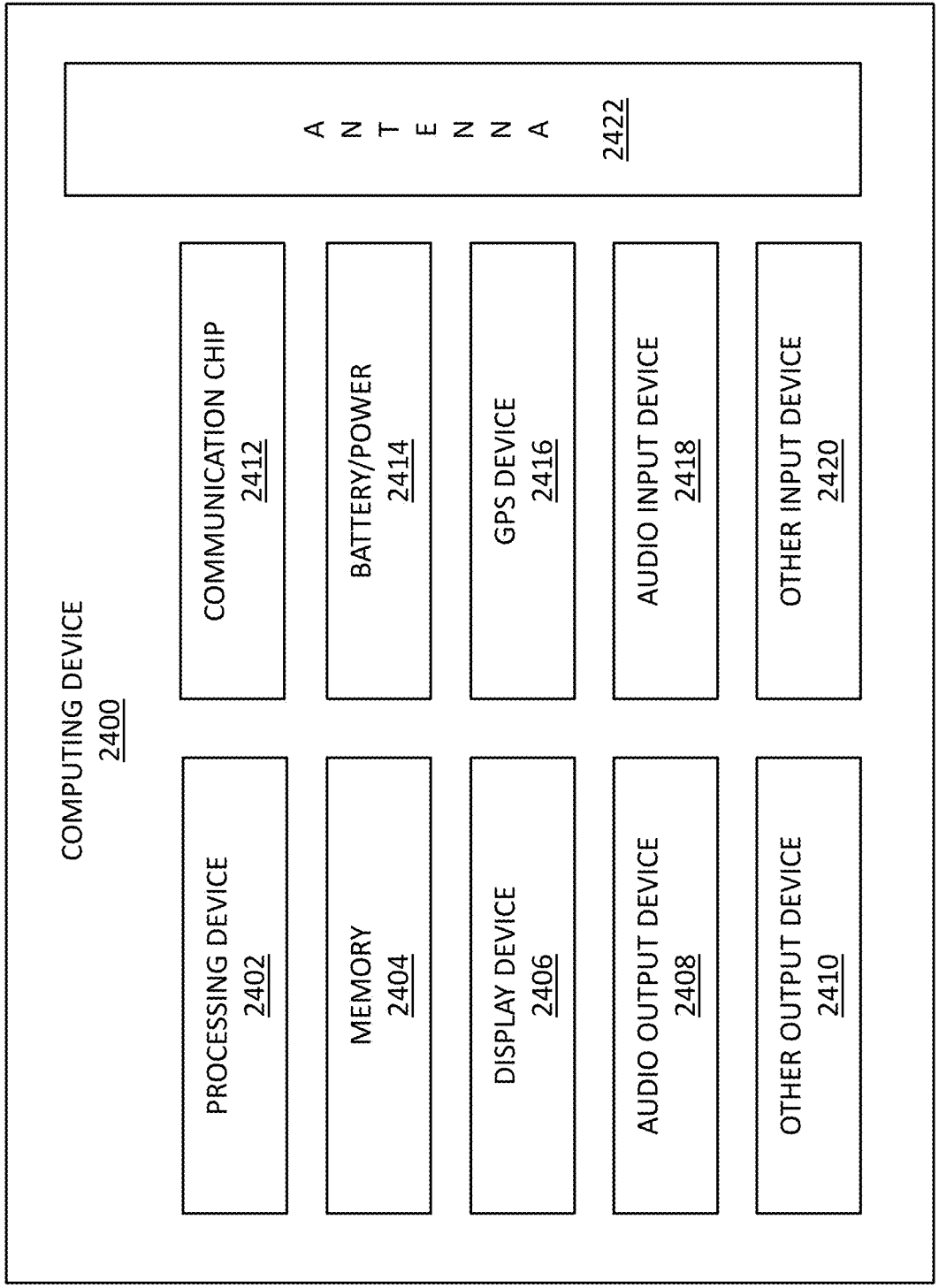
FIG. 9 is a block diagram of an example computing device that may include one or more memory arrays implementing 2T memory cells with stacked TFTs in accordance with any of the embodiments disclosed herein.

FIG. 9 is a block diagram of an example computing device 2400 that may include one or more components with one or more 2T memory cells with stacked TFTs in accordance with any of the embodiments disclosed herein. For example, any suitable ones of the components of the computing device 2400 may include a die (e.g., the die 2002 of FIG. 5B) including one or more 2T memory cells with stacked TFTs in accordance with any of the embodiments disclosed herein. Any of the components of the computing device 2400 may include the IC device 100 of FIG. 1, the IC device 400 of FIG. 4, the IC device 2100 of FIG. 6, any combination of these IC devices, and/or an IC package 2200 of FIG. 7. Any of the components of the computing device 2400 may include an IC device assembly 2300 of FIG. 8.

A number of components are illustrated in FIG. 9 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single system-on-chip (SoC) die.

Additionally, in various embodiments, the computing device 2400 may not include one or more of the components illustrated in FIG. 9, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid state memory, and/or a hard drive. In some embodiments, the memory 2404 may include memory that shares a die with the processing device 2402. This memory may be used as cache memory and may include embedded memory, e.g. a memory with 2T memory cells with stacked TFTs as described herein, and/or spin transfer torque magnetic random-access memory (STT-M RAM).

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

SELECT EXAMPLES

The following paragraphs provide various examples of the embodiments disclosed herein.

Example 1 provides a memory cell that includes an access TFT and a gain TFT. In such a cell, a first S/D electrode of the access TFT is coupled to a gate electrode of the gain TFT, the access TFT is in a first layer over a substrate, and the gain TFT is in a second layer over the substrate, the first layer being between the substrate and the second layer.

Example 2 provides the memory cell according to example 1, where the access TFT includes a channel material and a second S/D electrode, the first S/D electrode of the access TFT is over the channel material of the access TFT, and the channel material of the access TFT is over the second S/D electrode of the access TFT.

Example 3 provides the memory cell according to example 2, where the gain TFT includes a channel material, a first S/D electrode, and a second S/D electrode, the gate electrode of the gain TFT is between the substrate and the channel layer of the gain TFT, and the channel layer of the gain TFT is between the gate electrode of the gain TFT and the first and second S/D electrodes of the gain TFT.

Example 4 provides the memory cell according to examples 2 or 3, where the channel includes one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, and black phosphorus.

Example 5 provides the memory cell according to any one of the preceding examples, where a gate electrode of the access TFT is coupled to a write wordline.

Example 6 provides the memory cell according to any one of the preceding examples, where a second S/D electrode of the access TFT is coupled to a write bitline.

Example 7 provides the memory cell according to any one of the preceding examples, where a first S/D electrode of the gain TFT is coupled to a read wordline.

Example 8 provides the memory cell according to any one of the preceding examples, where a second S/D electrode of the gain TFT is coupled to a read bitline.

Example 9 provides the memory cell according to any one of the preceding examples, where the first S/D electrode of the access TFT is coupled to the gate electrode of the gain TFT by the first S/D electrode of the access TFT being coupled to a storage node of the memory cell and the gate electrode of the gain TFT being coupled to the storage node.

Example 10 provides the memory cell according to example 9, further including a capacitor that includes a first capacitor electrode, a second capacitor electrode, and a dielectric between the first capacitor electrode and the second capacitor electrode, where the first capacitor electrode is coupled to the storage node.

Example 11 provides the memory cell according to example 10, where the second capacitor electrode is coupled to a capacitor plateline.

Example 12 provides the memory cell according to examples 10 or 11, where the capacitor is a three-dimensional MIM capacitor.

Example 13 provides a memory cell that includes a substrate; a first TFT in a BEOL stack above the substrate; and a second TFT, coupled to the first TFT, in the BEOL stack, where the second TFT is further away from the substrate than the first TFT.

Example 14 provides the memory cell according to example 13, where the first TFT is a vertical TFT.

Example 15 provides the memory cell according to examples 13 or 14, where the second TFT is a horizontal TFT.

Example 16 provides the memory cell according to example 15, where the horizontal TFT is a horizontal bottom-gated TFT.

Example 17 provides the memory cell according to any one of examples 13-16, where a first source/drain electrode of the first TFT is coupled to a gate electrode of the second TFT.

Example 18 provides the memory cell according to any one of examples 13-17, where one or both of the first TFT and the second TFT include a channel material that includes one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, indium gallium zinc oxide (IGZO), indium telluride, molybdenite, molybdenum diselenide, tungsten diselenide, tungsten disulfide, and black phosphorus.

Example 19 provides the memory cell according to any one of examples 13-18, where the first TFT is the access TFT and the second TFT is the gain TFT according to any one of examples 1-12, and where the memory cell according to any one of examples 13-18 is the memory cell according to any one of examples 1-12.

Example 20 provides a memory array that includes a plurality of memory cells arranged in rows and columns, each memory cell including an access TFT and a gain TFT, where a first S/D electrode of the access TFT is coupled to a gate electrode of the gain TFT, the access TFT is in a first layer over a substrate, and the gain TFT is in a second layer over the substrate, the first layer being between the substrate and the second layer; and where for each sub-set of the plurality of memory cells arranged in a row i, a respective write wordline ($WWL_i$), coupled to a gate electrode of the access TFT of each memory cell of the sub-set of the plurality of memory cells arranged in the row.

Example 21 provides the memory array according to example 20, further including, for the each sub-set of the plurality of memory cells arranged in the row i, a respective read wordline ($RWL_i$), coupled to a first S/D electrode of the gain TFT of each memory cell of the sub-set of the plurality of memory cells arranged in the row.

Example 22 provides the memory array according to examples 20 or 21, where the each memory cell further includes a capacitor that includes a first capacitor electrode, a second capacitor electrode, and a dielectric between the first capacitor electrode and the second capacitor electrode, where the first capacitor electrode of the each memory cell is coupled to the first S/D electrode of the access TFT of the each memory cell; and the memory array further includes, for the each sub-set of the plurality of memory cells arranged in the row i, a respective capacitor plate line ($PL_i$), coupled to the second capacitor electrode of each memory cell of the sub-set of the plurality of memory cells arranged in the row.

Example 23 provides the memory array according to any one of examples 20-22, further including, for each sub-set of the plurality of memory cells arranged in a column j, a respective write bitline ($WBL_j$), coupled to a second S/D electrode of the access TFT of each memory cell of the sub-set of the plurality of memory cells arranged in the column.

Example 24 provides the memory array according to any one of examples 20-23, further including, for each sub-set of the plurality of memory cells arranged in a column j, a respective read bitline ($RBL_j$), coupled to a second S/D electrode of the gain TFT of each memory cell of the sub-set of the plurality of memory cells arranged in the column.

Example 25 provides an IC package that includes an IC die, including one or more of the memory cells according to any one of examples 1-19 and/or the memory array according to any one of examples 20-24, where the IC package also includes a further component, coupled to the IC die.

Example 26 provides the IC package according to example 25, where the further component is one of a package substrate, a flexible substrate, or an interposer.

Example 27 provides the IC package according to examples 25 or 26, where the further component is coupled to the IC die via one or more first level interconnects.

Example 28 provides the IC package according to example 27, where the one or more first level interconnects include one or more solder bumps, solder posts, or bond wires.

Example 29 provides a computing device that includes a circuit board; and a device coupled to the circuit board, where the device includes one or more of: one or more of the memory cells according to any one of examples 1-19, the memory array according to any one of examples 20-24, and the IC package according to any one of examples 25-28.

Example 30 provides the computing device according to example 29, where the computing device is a wearable computing device (e.g., a smart watch) or handheld computing device (e.g., a mobile phone).

Example 31 provides the computing device according to examples 29 or 30, where the computing device is a server processor.

Example 32 provides the computing device according to examples 29 or 30, where the computing device is a motherboard.

Example 33 provides the computing device according to any one of examples 29-32, where the computing device further includes one or more communication chips and an antenna.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:
1. An integrated circuit (IC) device, comprising:
a support;
a first thin-film transistor (TFT) in a first layer over the support;

a second TFT in a second layer over the support, wherein the first layer is between the support and the second layer, and each of the first TFT and the second TFT includes a pair of a source electrode and a drain electrode; and
a via having a first end and an opposing second end, wherein the first end is directly electrically connected with a first electrode of the pair of the first TFT and the second end is directly electrically connected with a gate electrode of the second TFT.

2. The IC device according to claim 1, wherein a gate electrode of the first TFT is directly connected to a write wordline.

3. The IC device according to claim 1, wherein a second electrode of the pair of the first TFT is directly connected to a write bitline.

4. The IC device according to claim 1, wherein a first electrode of the pair of the second TFT is directly connected to a read wordline.

5. The IC device according to claim 1, wherein a second electrode of the pair of the second TFT is directly connected to a read bitline.

6. The IC device according to claim 1, further comprising a capacitor having a capacitor electrode directly electrically connected to the first electrode of the pair of the first TFT, wherein the capacitor is closer to the support than the second TFT.

7. The IC device according to claim 1, further comprising:
a capacitor comprising a first capacitor electrode, a second capacitor electrode, and a capacitor insulator between the first capacitor electrode and the second capacitor electrode; and
an insulator material around the capacitor,
wherein:
the insulator material includes an opening substantially perpendicular to the support,
the first capacitor electrode includes a first conductive material on sidewalls and a bottom of the opening,
the capacitor insulator includes a dielectric material on the first conductive material on the sidewalls and the bottom of the opening, and
the second capacitor electrode includes a second conductive material in the opening.

8. The IC device according to claim 7, wherein the second conductive material is further away from the sidewalls of the opening.

9. The IC device according to claim 8, wherein the first capacitor electrode is directly electrically connected to the first electrode of the pair of the first TFT.

10. The IC device according to claim 7, wherein the first capacitor electrode is directly electrically connected to the first electrode of the pair of the first TFT.

11. The IC device according to claim 1, wherein the second end is closer to a channel region of the first TFT than the gate electrode of the second TFT.

12. The IC device according to claim 11, wherein the channel region of the first TFT is closer to the support than a channel region of the second TFT.

13. The IC device according to claim 1, wherein the first end is closer to a channel region of the first TFT than the second end.

14. An integrated circuit (IC) device, comprising:
a device layer;
a memory cell over the device layer, the memory cell comprising a stack of a first transistor and a second transistor; and
a via,
wherein:
along a line perpendicular to the device layer in a cross-section along a plane perpendicular to the device layer, a channel region of the first transistor is between the device layer and a channel region of the second transistor,
a gate electrode of the second transistor is directly electrically connected to one end of the via, and
one electrode of a source electrode and a drain electrode of the first transistor is directly electrically connected to another end of the via.

15. The IC device according to claim 14, wherein:
the memory cell is a first memory cell,
the IC device further includes a second memory cell comprising a stack of a third transistor and a fourth transistor,
a channel region of the third transistor is between the device layer and a channel region of the fourth transistor,
the first memory cell further includes a first capacitor connected to the one electrode of the source electrode and the drain electrode of the first transistor,
the second memory cell further includes a second capacitor connected to one electrode of a source electrode and a drain electrode of the third transistor, and
an individual one of the first capacitor and the second capacitor is further connected to a common conductive line parallel to the device layer.

16. The IC device according to claim 15, wherein:
an individual one of the first capacitor and the second capacitor includes a first capacitor electrode, a second capacitor electrode, and an insulator between the first capacitor electrode and the second capacitor electrode,
the first capacitor is connected to the one electrode of the source electrode and the drain electrode of the first transistor by having the first capacitor electrode of the first capacitor being directly electrically connected with the one electrode of the source electrode and the drain electrode of the first transistor,
the second capacitor is connected to the one electrode of the source electrode and the drain electrode of the third transistor by having the first capacitor electrode of the second capacitor being directly electrically connected with the one electrode of the source electrode and the drain electrode of the third transistor, and
an individual one of the first capacitor and the second capacitor is further connected to the common conductive line by having the second capacitor electrode of an individual one of the first capacitor and the second capacitor being directly electrically connected with the common conductive line.

17. The IC device according to claim 15, wherein a distance between the common conductive line and the channel region of the first transistor is smaller than a distance between the channel region of the second transistor and the channel region of the first transistor.

18. The IC device according to claim 14, further comprising a capacitor having a capacitor electrode directly electrically connected to the one electrode of the source electrode and the drain electrode of the first transistor, wherein the capacitor is closer to the device layer than the second transistor.

19. The IC device according to claim 14, wherein a gate electrode of the first transistor is directly electrically connected to a write wordline.

20. The IC device according to claim 14, wherein another electrode of the source electrode and the drain electrode of the first transistor is directly electrically connected to a write bitline.

21. The IC device according to claim 14, wherein one electrode of a source electrode and a drain electrode of the second transistor is directly electrically connected to a read wordline.

22. The IC device according to claim 21, wherein another electrode of the source electrode and the drain electrode of the second transistor is directly electrically connected to a read bitline.

23. An integrated circuit (IC) device, comprising:
- a first memory cell comprising a first transistor, a second transistor stacked over the first transistor, and a first capacitor connected to one of a source electrode and a drain electrode of the first transistor;
- a second memory cell comprising a third transistor, a fourth transistor stacked over the third transistor, and a second capacitor connected to one of a source electrode and a drain electrode of the third transistor; and
- a via having a first end and an opposing second end, wherein:
  - a gate electrode of the second transistor is connected to another one of the source electrode and the drain electrode of the first transistor,
  - the first end is directly connected to the another one of the source electrode and the drain electrode of the first transistor, and
  - the second end is directly connected to a gate electrode of the second transistor.

24. The IC device according to claim 23, further comprising a device layer, wherein the via is closer to the device layer than the channel region of the second transistor.

25. The IC device according to claim 23, wherein a distance between the second end and the channel region of the first transistor is smaller than a distance between the gate electrode of the second transistor and the channel region of the first transistor.

26. The IC device according to claim 23, further comprising a conductive line, wherein a distance between the conductive line and a channel region of the first transistor is smaller than a distance between a channel region of the second transistor and a channel region of the first transistor.

* * * * *